United States Patent
Tanaka

(10) Patent No.: US 9,692,008 B2
(45) Date of Patent: Jun. 27, 2017

(54) ORGANIC ELECTROLUMINESCENT DISPLAY DEVICE

(71) Applicant: Sharp Kabushiki Kaisha, Osaka-shi, Osaka (JP)

(72) Inventor: Tetsunori Tanaka, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/897,311

(22) PCT Filed: Feb. 28, 2014

(86) PCT No.: PCT/JP2014/055031
§ 371 (c)(1),
(2) Date: Dec. 10, 2015

(87) PCT Pub. No.: WO2014/199673
PCT Pub. Date: Dec. 18, 2014

(65) Prior Publication Data
US 2016/0141548 A1 May 19, 2016

(30) Foreign Application Priority Data
Jun. 11, 2013 (JP) ................................. 2013-123103

(51) Int. Cl.
*H01L 29/08* (2006.01)
*H01L 51/52* (2006.01)
*H01L 27/32* (2006.01)

(52) U.S. Cl.
CPC ...... *H01L 51/5246* (2013.01); *H01L 27/3276* (2013.01); *H01L 27/3288* (2013.01)

(58) Field of Classification Search
USPC ................ 257/40, 98; 313/504, 506; 345/76
See application file for complete search history.

(56) References Cited

U.S. PATENT DOCUMENTS 8,829,787 B2 * 9/2014 Schwab .............. H01L 51/0021
313/498
8,926,389 B2 * 1/2015 Nishido .............. H01L 51/0097
445/24

(Continued)

FOREIGN PATENT DOCUMENTS

JP 2003-282241 A 10/2003
JP 2004-030974 A 1/2004

(Continued)

OTHER PUBLICATIONS

Official Communication issued in International Patent Application No. PCT/JP2014/055031, mailed on Apr. 8, 2014.

*Primary Examiner* — Mohammed Shamsuzzaman
(74) *Attorney, Agent, or Firm* — Keating & Bennett, LLP

(57) ABSTRACT

An organic electroluminescent display device includes a display region configured to display pixels; a frame region configured to surround the display region; a substrate; an organic electroluminescent element disposed on the substrate; a sealing member configured to cover the organic electroluminescent element; a lead wire disposed on the substrate and extending from a region covered with the sealing member to an outer side of the sealing member; and one or more organic insulators disposed within the frame region instead of within the display region. The lead wire includes two opposite side portions. The one organic insulator or each organic insulator covers part of at least one of the two side portions. The sealing member covers the one or more organic insulators.

7 Claims, 16 Drawing Sheets

(56) References Cited

U.S. PATENT DOCUMENTS

| | | | |
|---|---|---|---|
| 9,351,349 B2* | 5/2016 | Sakamoto | H05B 33/10 |
| 2003/0209708 A1 | 11/2003 | Kubota | |
| 2005/0023964 A1 | 2/2005 | Omura et al. | |
| 2005/0062057 A1* | 3/2005 | Yamazaki | H01L 27/3244 |
| | | | 257/98 |
| 2005/0110716 A1* | 5/2005 | Eida | H01L 27/3248 |
| | | | 345/76 |
| 2006/0061269 A1* | 3/2006 | Tsuchiya | H01L 27/3276 |
| | | | 313/506 |
| 2007/0159068 A1* | 7/2007 | Miyake | H01L 27/3283 |
| | | | 313/504 |
| 2008/0211393 A1* | 9/2008 | Yaegashi | H01L 51/5253 |
| | | | 313/504 |
| 2010/0301743 A1* | 12/2010 | Kodama | H01L 51/5246 |
| | | | 313/504 |
| 2013/0228756 A1* | 9/2013 | Lee | H01L 51/52 |
| | | | 257/40 |

FOREIGN PATENT DOCUMENTS

| | | |
|---|---|---|
| JP | 2004-335267 A | 11/2004 |
| JP | 2005-093396 A | 4/2005 |
| JP | 2005-100979 A | 4/2005 |
| JP | 2005-251630 A | 9/2005 |
| JP | 2006-065320 A | 3/2006 |
| JP | 2006-164737 A | 6/2006 |
| JP | 2008-192426 A | 8/2008 |
| JP | 2010-277856 A | 12/2010 |
| JP | 2011-228315 A | 11/2011 |
| JP | 2012-134173 A | 7/2012 |
| WO | 2010/150648 A1 | 12/2010 |

* cited by examiner (a)

(b)

(c)

ORGANIC ELECTROLUMINESCENT DISPLAY DEVICE

TECHNICAL FIELD

The present disclosure relates to organic electroluminescent display devices (hereinafter also referred to as "organic EL display devices"). More specifically, the present disclosure relates to an organic EL display device suitable as a display device including an organic electroluminescent element in each pixel (hereinafter the element is also referred to as an "organic EL element").

BACKGROUND ART

In recent years, flat panel displays have been used in various products or various fields. Such flat panel displays have been required to have a larger size and a higher quality and to reduce power consumption.

In these circumstances, organic EL display devices including organic EL elements that utilize electroluminescence of organic materials have been attracting great attention as all-solid flat panel displays excellent in terms of, for example, being driven at low voltages and having fast response time and self-luminousness.

An organic EL element includes a pair of electrodes functioning as an anode and a cathode and an electroluminescence layer (hereinafter also referred to as an "EL layer") disposed between the paired electrodes. An organic EL element is typically subject to moisture and oxygen. Intrusion of moisture and/or oxygen into an organic EL element promotes degradation of element properties of the organic EL element such as luminance. Various opinions have been offered about this degradation mechanism. One of them expresses that the degradation occurs due to oxidization or hydroxidization of a luminescent material and/or a cathode material. To inhibit degradation of organic EL elements, organic EL display devices are usually subjected to sealing. Specifically, for example, a sealant is provided around an organic EL element and a space enclosed with the sealant is filled with a resin desiccating agent.

Other examples of the technology for improving resistance of an organic EL element to moisture and oxygen include the followings.

Disclosed is a light emitting device in which a multilayer structure including an inorganic film, an organic film, and an inorganic film is not continuously provided from a lower portion of a sealant to a lower portion of a cathode of a light-emitting element (see, for example, PTL 1).

Also disclosed is an organic EL element that at least includes a first substrate, a sealing substrate opposing the first substrate while having a distance from the first substrate, a sealant that seals the first substrate and the sealing substrate and forms a sealed space between the first substrate and the sealing substrate, a source line and a gate line disposed on the first substrate, and a pixel electrode electrically connected to the gate line and the source line. The source line and the gate line are disposed in the sealed space. The organic EL element includes a source lead electrode that is connected with the source line and drawn from the sealed space. The source lead electrode is formed of the same film as the gate line (see, for example, PTL 2).

Also disclosed is a display device in which a layer containing a water-permeable organic material is sealed with a sealant (see, for example, PTL 3).

Also disclosed is a light emitting device that includes a substrate, a light-emitting element including an organic electroluminescence layer between a pair of electrodes stacked on the substrate in a thickness direction of the substrate, a lead wire disposed on the substrate and connected with the pair of electrodes of the light-emitting element, and a sealing member that seals the light-emitting element. An insulating layer containing an inorganic oxide is disposed on the substrate at at least a portion around the light-emitting element. The sealing member is bonded to the insulating layer containing the inorganic oxide and disposed around the light-emitting element using an adhesive interposed between the sealing member and the insulating layer (see, for example, PTL 4).

Also disclosed is an organic EL display device including a device substrate on which a pixel region is formed by arranging multiple pixels in a matrix, an organic EL element and a driving transistor for driving the organic EL element disposed in each pixel of the pixel region, and two inter-organic-layer insulating films disposed above the driving transistors and below the organic EL elements. A sealing substrate is bonded to the device substrate using a sealing member disposed over a region surrounding a pixel region. The two inter-organic-layer insulating films are divided by a dividing region disposed between the sealing member and the pixel region (see, for example, PTL 5).

Also disclosed is an organic electronics panel including an organic electronics element. In the organic electronics element, an organic compound layer, including a functional layer containing at least an organic compound, is tightly held between a pair of electrodes disposed on a support substrate. The organic electronics element is tightly sealed with a sealing member, covering the organic electronics element, between the sealing member and the support substrate in the state where the electrodes and the organic compound layer are tightly held. A junction of a lead portion of one of the electrodes and an electrode lead for connection with an external driving circuit is located within a tightly sealed region covered with the sealing member. The electrode lead is drawn from the tightly sealed region (see, for example, PTL 6).

Also disclosed is a display device including a support substrate, on which a display region is formed by arranging organic EL elements and a surrounding region is formed by disposing an organic-EL-element driving circuit around the display region. The organic EL element is sealed by an opposing substrate using a sealing resin. A wire is disposed in the surrounding region on the support substrate in which the driving circuit is disposed. An insulating film and a separation groove, which divides the insulating film, are also disposed on the support substrate. A protrusion is disposed on the opposing substrate at a portion opposing the separating groove. The protrusion is inserted into the separation groove (see, for example, PTL 7).

Also disclosed is a display device in which a sealant is disposed around an inter-layer insulator to prevent moisture or oxygen from intruding through an exposed portion of the inter-layer insulator (see, for example, PTL 8).

CITATION LIST

Patent Literature

PTL 1: Japanese Unexamined Patent Application Publication No. 2011-228315
PTL 2: Japanese Unexamined Patent Application Publication No. 2006-164737
PTL 3: Japanese Unexamined Patent Application Publication No. 2006-65320

PTL 4: Japanese Unexamined Patent Application Publication No. 2008-192426
PTL 5: Japanese Unexamined Patent Application Publication No. 2004-335267
PTL 6: International Publication No. 2010/150648
PTL 7: Japanese Unexamined Patent Application Publication No. 2012-134173
PTL 8: Japanese Unexamined Patent Application Publication No. 2005-100979

SUMMARY

Technical Problem

Employing these measures, however, has not yet attained sufficient inhibition of degradation and further inhibition of degradation is required.

An organic EL display device that the inventors have examined includes a substrate, an organic EL element disposed on the substrate, and a sealing member configured to cover the organic EL element. In addition, a lead wire is disposed on the substrate. The lead wire is drawn to the outside of the sealing member from a sealed region sealed by the substrate and the sealing member. If a wire formed by stacking two or more layers such as titanium (Ti)-aluminum (Al)-titanium (Ti) layers (or a multilayer wire) is used as this lead wire, the moisture and oxygen in the air are highly likely to intrude from the outside into the sealed region along the side portions of the lead wire. The reason for this is described as follows.

The etching rate varies between two or more layers included in the multilayer wire and the amount of side etching thus varies between those layers. The side portions of the multilayer wire are thus likely to have an overhanging shape, that is, a shape in which the topmost layer sticks out sideways. It is usually difficult to sufficiently cover the side portions having such a shape with a sealant or an inorganic barrier film formed by plasma chemical vapor deposition (CVD). This is because such an inorganic barrier film typically has a poor property of covering stepped portions and the sealant typically has high viscosity. Thus, the inventor has noted that using a multilayer wire as a lead wire highly likely causes gaps between the side portions of the lead wire and the inorganic barrier film or the sealant along the side portions of the lead wire and these gaps are used as intrusion paths for moisture and oxygen into the sealed region.

In the display device described in PTL 8, for example, a sealant is disposed immediately above the lead wire for inputting signals to the display region. Thus, if, for example, a Ti—Al—Ti multilayer wire is used as a lead wire, the coverage of the sealant would be insufficient due to the above-described problem of the shape of the side portions and intrusion paths for the moisture and oxygen would be finally formed along the side portions of the lead wire. Degradation of the light-emitting element would thus be promoted.

To solve such problems, it is conceivable to form on a lead wire an organic insulating film made of an organic material, for example, an inter-layer insulating film. In this case, however, it is concerned that moisture and oxygen may intrude into the sealed region through a clearance between the sealant and the organic insulating film. This is because the adhesion of the sealant to the organic insulating film is generally poor and the sealant and the organic insulating film are more likely to be separated at the interface therebetween.

FIGS. 43(a) to 43(c) are schematic diagrams of the light emitting device described in PTL 1, where FIG. 43(a) is a cross-sectional view of the light emitting device taken along the line A-B in FIG. 43(b), FIG. 43(b) is a plan view of the light emitting device, and FIG. 43(c) is a cross-sectional view of the light emitting device taken along the line C-D in FIG. 43(b). FIGS. 44(a) and 44(b) are schematic cross-sectional views of the light emitting device described in PTL 1 in the case where a particle adheres to a wire.

As illustrated in FIGS. 43(a) to 43(c), the display device described in PTL 1 includes a substrate 1000, a primary insulator film 1001 disposed on the substrate 1000, an organic insulating film 1002, a wire 1003 and a lower electrode 1004 disposed on the organic insulating film 1002, an organic insulating film 1005 disposed on the wire 1003 and the lower electrode 1004, a light-emitting stack 1006 disposed on the lower electrode 1004 and the organic insulating film 1005, an upper electrode 1007 disposed on the light-emitting stack 1006, an opposing substrate 1009, a sealant 1008, and a desiccant 1017. Thus, even if the wire 1003 is a multilayer wire including, for example, Ti—Al—Ti layers, the spaces under the overhangs of the uppermost layer are expected to be filled with the organic insulating film 1005. However, as illustrated in FIGS. 43(a) and 43(b), the organic insulating film 1005 extends from under the sealant 1008 to a portion located further inward of the sealant 1008. Thus, as illustrated in FIG. 44(b), if the organic insulating film 1005 fails to completely block the intrusion paths extending along the side portions of the wire 1003 due to a cause such as an adhesion of a particle to the wire 1003 during the manufacturing process, moisture and oxygen would intrude into the sealed region through the clearance between the sealant 1008 and the organic insulating film 1005, as illustrated in FIG. 44(a).

In the organic EL element described in PTL 2, on the other hand, a gate line or a pixel electrode and the source lead electrode are made of the same film. The source lead electrode is electrically connected to a source line having an overhanging shape in the sealed space and is drawn to the outside of the sealed space so as to cross the sealant. This configuration thus prevents moisture and oxygen from intruding into the inside of the element along the side portions of the source lead electrode. The organic EL element described in PTL 2, however, has the following problems. Firstly, the side portions of the source lead electrode need to have a fine shape, for example, a forward tapered shape. Thus, the material of the source lead electrode and the multilayer structure of the source lead electrode have to be selected from limited options. Furthermore, the source lead electrode needs to be connected to the source line through a contact hole. This requirement may bring about contact failure at the connection portion and reduction of yields. Moreover, reduction of the contact resistance at the contact portion usually requires surface treatment such as dry etching or chemical cleaning. Further, a region for forming a contact hole has to be allocated, thereby increasing a frame region.

The embodiment of the invention is made in view of the above-described situation and aims to provide an organic EL display device that enables size reduction of a frame and that has high reliability and high productivity.

Solution to Problem

An aspect of the embodiment may be an organic electroluminescent display device including a display region configured to display pixels; a frame region configured to surround the display region; a substrate; an organic electroluminescent element disposed on the substrate; a sealing member configured to cover the organic electroluminescent element; a lead wire disposed on the substrate and extending from a region covered with the sealing member to an outer side of the sealing member; and one or more organic insulators disposed within the frame region instead of within the display region. The lead wire may include two opposite side portions. The one or more organic insulators may each cover part of at least one of the two side portions. The sealing member may cover the one or more organic insulators. Hereinbelow, this organic electroluminescent display device is also referred to as a display device according to the embodiment.

Preferable embodiments of the display device according to the invention are described below. The preferable embodiments described below may be appropriately combined together. An embodiment formed by combining two or more of the preferable embodiments described below is also regarded as one preferable embodiment.

The one organic insulator or each organic insulator may be linearly disposed so as to cross the lead wire and may cover part of each of the two side portions.

The one or more organic insulators may be provided in a plurality. The plurality of organic insulators may each be disposed in an island form. At least one of the plurality of organic insulators may be disposed on each of the two side portions. The plurality of organic insulators may be arranged in a staggered manner.

The organic electroluminescent display device according to the embodiment may further include an edge cover. The organic electroluminescent element may include a first electrode, an electroluminescence layer stacked on the first electrode, and a second electrode stacked on the electroluminescence layer. The edge cover may overlap an edge portion of the first electrode. The one or more organic insulators may be made of the same material as the edge cover.

The organic electroluminescent display device according to the embodiment may further include an inter-layer insulating film. The organic electroluminescent element may include a first electrode, an electroluminescence layer stacked on the first electrode, and a second electrode stacked on the electroluminescence layer. The inter-layer insulating film may be disposed between the first electrode and the substrate. The one or more organic insulators may be made of the same material as the inter-layer insulating film.

The substrate is a first substrate. The sealing member may include a second substrate opposing the first substrate and a sealant that bonds the first substrate and the second substrate together. The one or more organic insulators may be covered with the sealant.

The sealing member may include a barrier film formed by stacking a plurality of insulator films one on top of another. The plurality of insulator films may include an inorganic insulating film. The one or more organic insulators may be covered with the barrier film.

The lead wire may include a first layer and a second layer stacked on the first layer. The second layer may include an overhanging portion sticking out to a side of the first layer.

Advantageous Effects of Invention

The embodiment of the invention can provide an organic EL display device that enables size reduction of a frame and that has high reliability and high productivity.

BRIEF DESCRIPTION OF DRAWINGS

FIG. 43(a) is a cross-sectional view of the light emitting device taken along the line A-B in FIG. 43(b), FIG. 43(b) is a plan view of the light emitting device, and FIG. 43(c) is a cross-sectional view of the light emitting device taken along the line C-D in FIG. 43(b).

DESCRIPTION OF EMBODIMENTS

Figure 1:
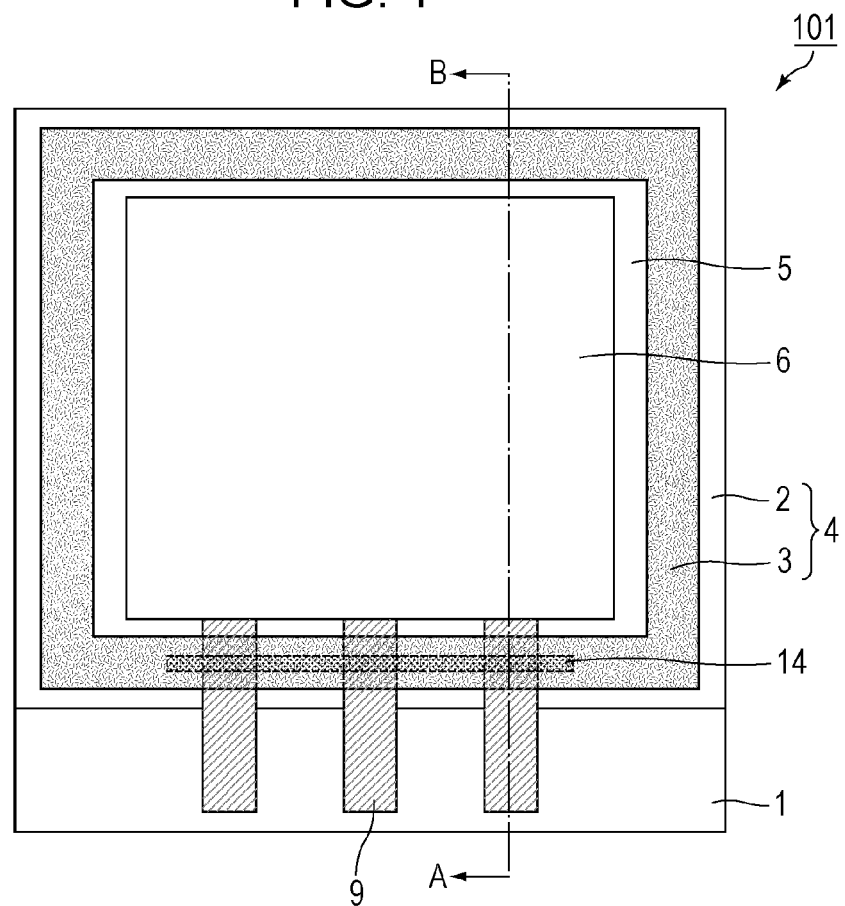
FIG. 1 is a schematic plan view of an organic EL display device according to the first embodiment.

Hereinbelow, the invention is described in further detail referring to the drawings using embodiments. The invention, however, is not limited to these embodiments.

First Embodiment

Figure 2:
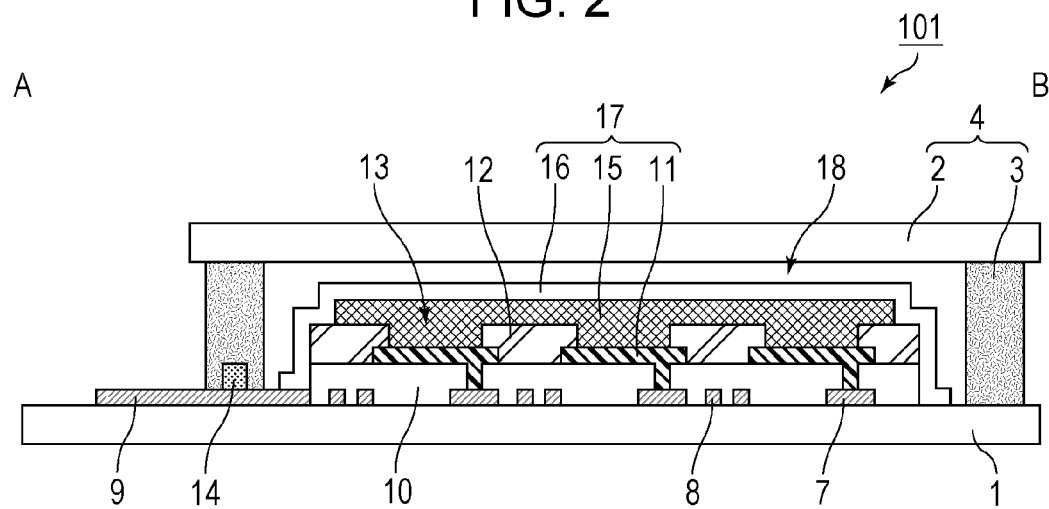
FIG. 2 is a schematic cross-sectional view of the organic EL display device according to the first embodiment and illustrates a cross-sectional structure taken along the line A-B in FIG. 1.
Figure 3:
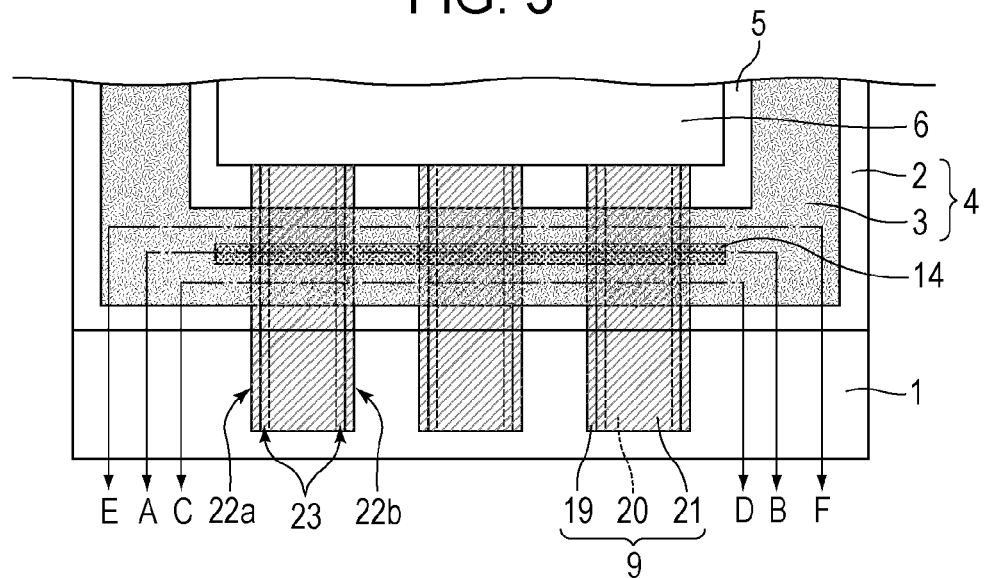
FIG. 3 is a schematic plan view of the organic EL display device according to the first embodiment.
Figure 4:
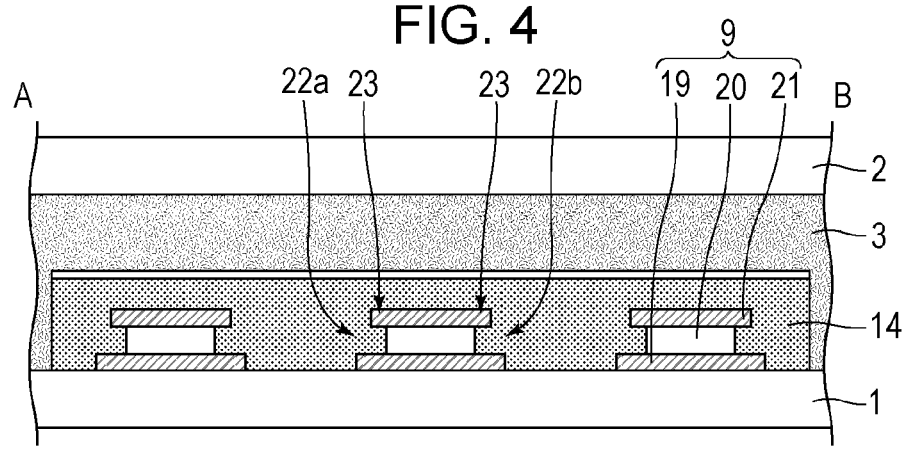
FIG. 4 is a schematic cross-sectional view of the organic EL display device according to the first embodiment and illustrates a cross-sectional structure taken along the line A-B in FIG. 3.
Figure 5:
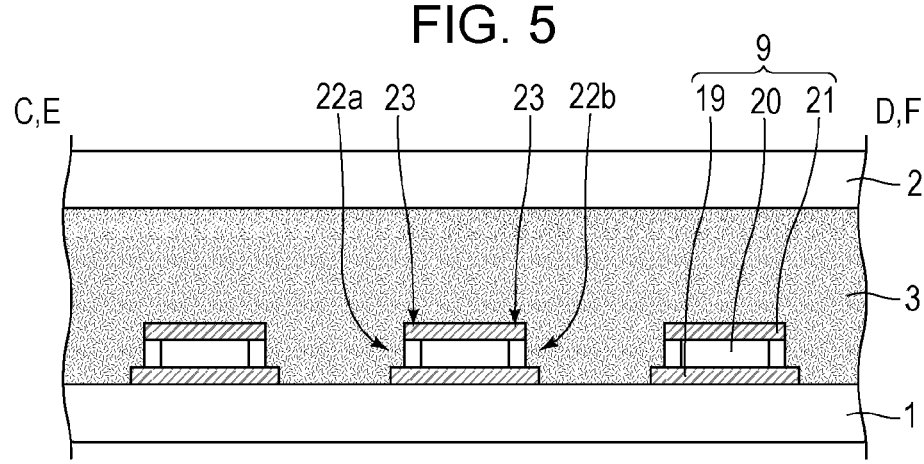
FIG. 5 is a schematic cross-sectional view of the organic EL display device according to the first embodiment and illustrates a cross-sectional structure taken along the line C-D and the line E-F in FIG. 3.

FIGS. 1 and 3 are schematic plan views of an organic EL display device according to the first embodiment. FIGS. 2, 4, and 5 are schematic cross-sectional views of the organic EL display device according to the first embodiment. FIG. 2 illustrates a cross-sectional structure taken along the line A-B in FIG. 1. FIG. 4 illustrates a cross-sectional structure taken along the line A-B in FIG. 3. FIG. 5 illustrates a cross-sectional structure taken along the line C-D and the line E-F in FIG. 3.

An organic EL display device 101 according to the first embodiment is an active-matrix-driven organic EL display device. As illustrated in FIG. 2, the organic EL display device 101 includes a first substrate 1, a second substrate 2 opposing the first substrate 1, and a sealant 3 interposed between the substrates 1 and 2. The first substrate 1 corresponds to a substrate of a display device according to the invention. The second substrate 2 and the sealant 3 function as a sealing member 4. The sealant 3 is disposed along the edge portion of the second substrate 2 so as to be in a frame form. The organic EL display device 101 according to the first embodiment may be a passive-matrix-driven organic EL display device.

In this description, the edge portion means a portion located far from the center of the object and close to the outside.

As illustrated in FIG. 1, a display region 6 that displays an image is formed in a region surrounded by the sealant 3. Multiple pixels, not illustrated, arranged in a matrix are disposed in the display region 6. Each pixel may include subpixels of multiple colors (for example, three colors of red, green, and blue). The organic EL display device 101 according to the first embodiment may be a full-color display device or a monochrome display device. A frame-shaped frame region 5 is disposed around the display region 6. The frame region 5 does not display an image. The sealant 3 is disposed in the frame region 5.

As illustrated in FIG. 2, thin film transistors (TFT) 7, signal lines 8, lead wires 9, an inter-layer insulating film 10, first electrodes 11, and an edge cover 12 are disposed on the first substrate 1. An organic insulator 14 is disposed immediately above a portion of the lead wire 9. An electroluminescence layer (EL layer) 15 and a second electrode 16 are disposed in this order on the first electrodes 11. The first electrodes 11, the EL layer 15, and the second electrode 16 function as an organic EL element 17. Although not illustrated, a base coat layer, a semiconductor layer, a gate insulator film, an inter-inorganic-layer insulating film, and a terminal connected to a mount component are also disposed on the first substrate 1. The signal lines 8 include wires such as a gate wire and a source wire. Examples of a mount component include a driver or a driving circuit, such as a gate driver and a source driver, and flexible printed substrates or flexible printed circuits. The driver may be monolithically formed on the first substrate 1. Hereinbelow, the first substrate 1 and components disposed on the first substrate 1 are also collectively referred to as a TFT substrate.

The edge cover 12 has openings 13 (portions through which the first electrodes 11 are exposed) in correspondence with the pixels or the subpixels. A light-emitting region is disposed in each opening 13. The light-emitting region forms each pixel or each subpixel. The edge cover 12 is disposed on the inter-layer insulating film 10 and partially overlaps the edge portions of the first electrodes 11. The inter-layer insulating film 10 is interposed between the first electrodes 11 and the first substrate 1. More specifically, the inter-layer insulating film 10 is disposed between the first electrodes 11 and electrically conductive members (such as the TFTs 7 or the signal lines 8) underlying the first electrodes 11. Each first electrode 11 is electrically connected with the corresponding TFT 7 through a contact hole formed in the inter-layer insulating film 10.

Either the first electrodes 11 or the second electrode 16 function/functions as an anode and the other function/functions as a cathode. In the case where the first electrodes 11 function as an anode, layers such as a hole injection layer, a hole transport layer, a light-emitting layer, an electron transport layer, and an electron injection layer are sequentially stacked one on top of another on the first electrodes 11 to form the EL layer 15 and the second electrode 16 is formed on the EL layer 15 to function as a cathode. A single one of these layers may have two or more functions. For example, instead of separately forming a hole injection layer and a hole transport layer, a layer concurrently functioning as a hole injection layer and a hole transport layer may be formed. In addition, a layer such as a carrier blocking layer may be appropriately inserted. In the case where the second electrode functions as an anode, these layers may be stacked one on top of another in the opposite order.

In this description, the layers interposed between the first electrode and the second electrode are collectively referred to as an EL layer.

The organic EL display device 101 according to the embodiment may be either a bottom emission device that emits light from the TFT substrate side or a top emission device that emits light from the sealing member 4 side. In the former case, transparent or semitransparent electrodes are used as the first electrodes 11 and a reflecting electrode is used as the second electrode 16. In the latter case, the combination of electrodes opposite to those of the former is used. The optical properties of the first electrodes 11 and the second electrode 16, such as a transmittance and a reflectance, are not limited to particular ones and may be appropriately determined.

A sealed region 18 enclosed by the first substrate 1 and the sealing member 4 are sealed by the first substrate 1 and the sealing member 4. The organic EL element 17 disposed in the sealed region 18 is also sealed by the first substrate 1 and the sealing member 4. This configuration prevents moisture and oxygen from intruding into the sealed region 18 from the outside and inhibits degradation of the organic EL element 17. The space between the TFT substrate and the second substrate 2 may be filled with a resin material containing a desiccant and/or oxygen absorbent. A desiccant may be attached to the surface of the second substrate 2 located closer to the TFT substrate.

As illustrated in FIG. 3, each lead wire 9 extends from the region covered with the sealing member 4, such as the display region 6, to a portion outside the sealing member 4 so as to cross the sealant 3. The purposes of the lead wires 9, that is, components to which the lead wires 9 are connected are not limited to particular ones and may be appropriately determined independent of one another. Examples of components to which the lead wires 9 are connected include the second electrode 16, the signal lines 8, a monolithic driving circuit, and terminals (not illustrated).

As illustrated in FIGS. 4 and 5, each lead wire 9 is a wire (multilayer wire) formed by stacking two or more layers one on top of another and preferably has a configuration in which a lower layer 19, a middle layer 20, and an upper layer 21 are stacked one on top of another in this order. More specifically, each lead wire 9 may have a Ti—Al—Ti multilayer structure. The middle layer 20 and the upper layer 21 respectively correspond to the first layer and the second layer of the display device according to the invention.

As described below, the lead wires 9 are formed through a photolithography process including wet etching or dry etching. Since the etching rate varies between two or more layers included in the multilayer wire, the amount by which the layers are side-etched during wet etching or dry etching varies. Thus, both side portions 22a and 22b of each lead wire 9, that is, two opposite side portions 22a and 22b are more likely to have an overhanging shape, that is, a shape in which the uppermost layer sticks out sideways. In this case, the upper layer 21 includes overhanging portions 23 that stick out to the side of the middle layer 20 from above the middle layer 20. As illustrated in FIG. 3, the overhanging portions 23 are formed so as to extend along the outline of the lead wire 9. The width of the middle layer 20 is smaller than the width of the upper layer 21 and the width of the lower layer 19. The etching rate of the middle layer 20 is higher than the etching rates of the upper layer 21 and the lower layer 19. Thus, the middle layer 20 is etched faster than the upper layer 21 and the lower layer 19.

As illustrated in FIG. 3, the organic insulator 14 is formed in a pattern of a single line (strip) extending so as to cross the multiple lead wires 9. As illustrated in FIGS. 3 and 4, the patterned organic insulator 14 covers portions of the side portion 22a and the side portion 22b of each lead wire 9.

A sealant region is disposed around the display region 6. In the sealant region, a material of the sealant 3 (also referred to as a sealing material, below) is applied to the first substrate 1 and the second substrate 2 is bonded to the first substrate 1. The organic insulator 14 is disposed in the frame region 5, specifically, in the sealant region and not disposed in the display region 6. As described above, the organic insulator 14 is a component separate from the inter-layer insulating film 10 and the edge cover 12. The organic insulator 14 is neither connected with the inter-layer insulating film 10 and the edge cover 12 nor overlaps the edge portions of the first electrodes 11. The entirety of the organic insulator 14 is covered with the sealant 3. The entire periphery of the organic insulator 14 is closely attached to the sealant 3. Components such as the lead wires 9, the first substrate 1, a semiconductor layer, a gate insulator film, and an inter-inorganic-layer insulating film, which may be disposed around the organic insulator 14, are all made of inorganic materials. The sealant 3 is closely attached to these components made of inorganic materials around the organic insulator 14.

Examples of the sealing material include ultraviolet cure and/or thermoset epoxy resins. The viscosity of these materials is normally as high as several hundred pascal-seconds. Thus, as illustrated in FIG. 5, the spaces under the overhanging portions 23 of each lead wire 9 cannot usually be filled with a sealing material. Examples of the method for forming the sealant 3 include application methods such as dispensing and screen printing. The sealant 3 may have an oxygen-getter function.

Before describing the operation and effects of the embodiment, first and second comparative examples that the inventors have examined are described below.

Figure 6:
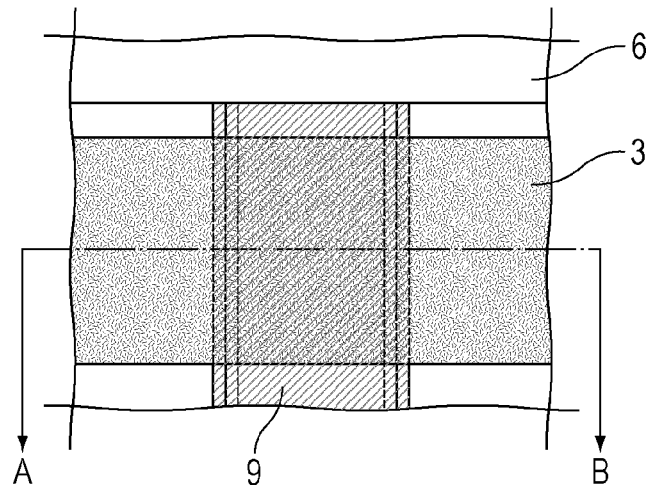
FIG. 6 is a schematic plan view of an organic EL display device according to a first comparative example.
Figure 7:
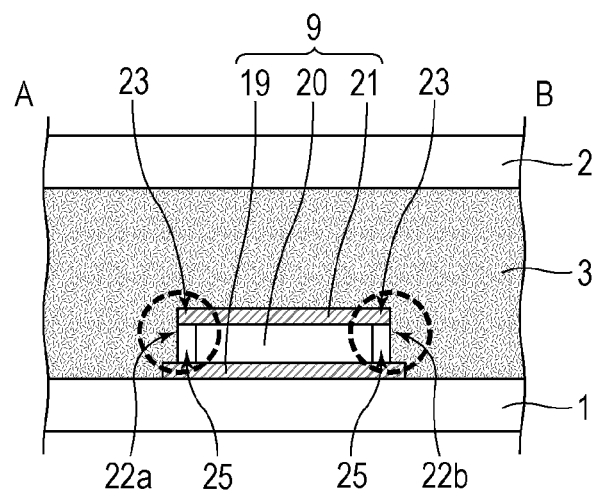
FIG. 7 is a schematic cross-sectional view of the organic EL display device according to the first comparative example and illustrates a cross-sectional structure taken along the line A-B in FIG. 6.

FIG. 6 is a schematic plan view of an organic EL display device according to the first comparative example. FIG. 7 is a schematic cross-sectional view of the organic EL display device according to the first comparative example and illustrates a cross-sectional structure taken along the line A-B in FIG. 6.

In this comparative example, the organic insulator 14 is not disposed on the lead wire 9, as illustrated in FIG. 6, and only the sealant 3 is disposed on the lead wire 9. Thus, as illustrated in FIG. 7, the spaces under the overhanging portions 23 of the upper layer 21 of the lead wire 9 are not filled with the sealant 3 and gaps 25 occur between the sealant 3 and the side portions 22a and 22b of the lead wire 9. The gaps 25 occur specifically between the middle layer 20 and the sealant 3. Thus, paths for moisture and oxygen to intrude into the sealed region 18 are formed along the side portions 22a and 22b.

Figure 8:
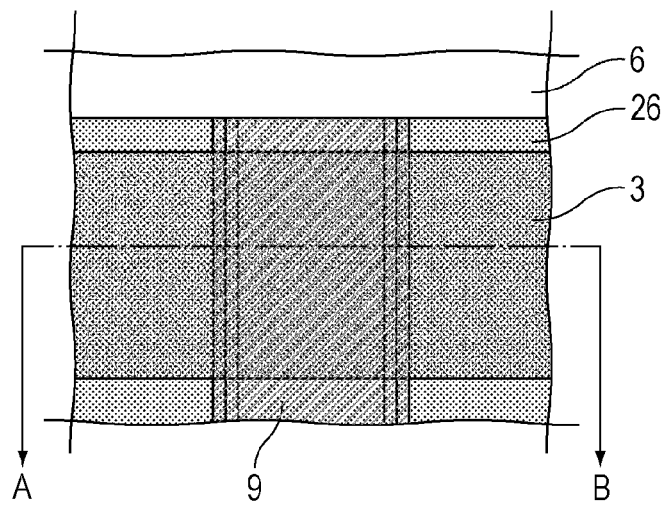
FIG. 8 is a schematic plan view of an organic EL display device according to a second comparative example.
Figure 9:
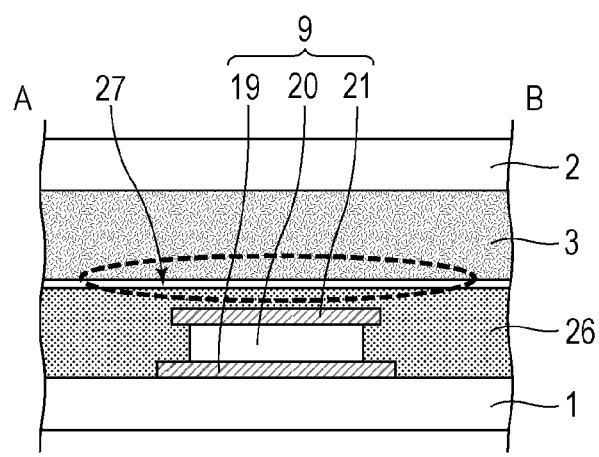
FIG. 9 is a schematic cross-sectional view of an organic EL display device according to the second comparative example and illustrates a cross-sectional structure taken along the line A-B in FIG. 8.

FIG. 8 is a schematic plan view of an organic EL display device according to the second comparative example. FIG. 9 is a schematic cross-sectional view of the organic EL display device according to the second comparative example and illustrates a cross-sectional structure taken along the line A-B in FIG. 8.

In this comparative example, as illustrated in FIG. 8, an organic insulating film 26 that is not subjected to patterning is formed under the sealant 3. The adhesion of the sealant to an organic insulator is typically poor. Thus, as illustrated in FIG. 9, the sealant 3 and the organic insulating film 26 are more likely to be separated at the interface therebetween and a clearance 27 occurs therebetween. Thus, a path for moisture and oxygen to intrude into the sealed region 18 is formed between the sealant 3 and the organic insulating film 26.

Figure 10:
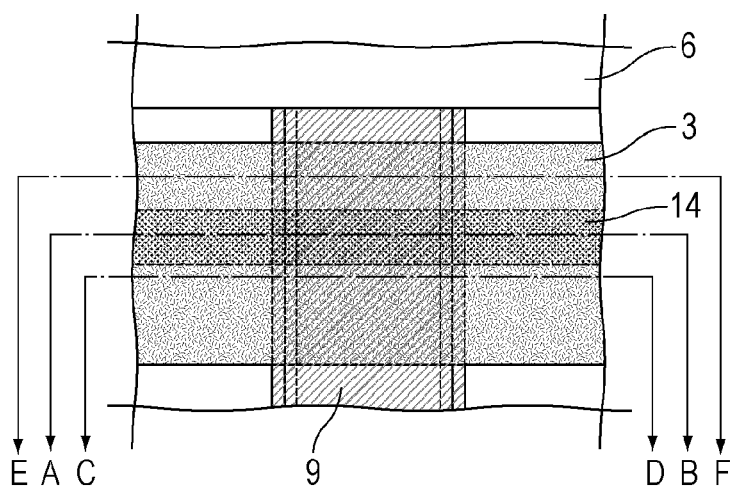
FIG. 10 is a schematic plan view of the organic EL display device according to the first embodiment.
Figure 11:
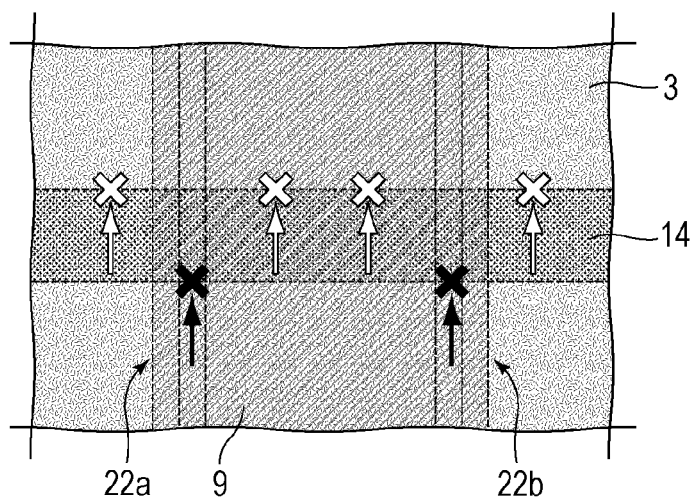
FIG. 11 is a schematic plan view of the organic EL display device according to the first embodiment.

FIGS. 10 and 11 are schematic plan views of the organic EL display device according to the first embodiment. In FIG. 11, the arrows indicate intrusion paths for moisture and oxygen and the cross marks indicate block points on the intrusion paths.

In this embodiment, as illustrated in FIG. 10, each lead wire 9 has a portion covered with the organic insulator 14 and portions left without being covered with the organic insulator 14. As illustrated in FIG. 11, the intrusion path extending along the side portion 22a or 22b of the lead wire 9 is thus blocked at the portion covered with the organic insulator 14 (see solid arrows and cross marks). At the portions left without being covered with the organic insulator 14, the intrusion path between the sealant 3 and the organic insulator 14 is blocked (see solid-white arrows and cross marks). In this manner, the likelihood of moisture and oxygen intruding into the sealed region 18 can be reduced, whereby degradation of the organic EL element can be inhibited.

Figure 12:
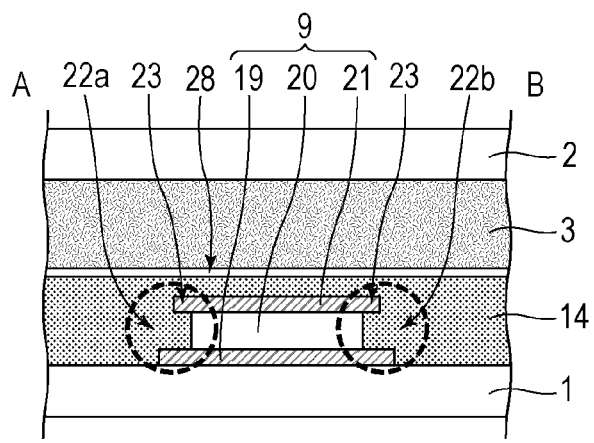
FIG. 12 is a schematic cross-sectional view of the organic EL display device according to the first embodiment and illustrates a cross-sectional structure taken along the line A-B in FIG. 10.
Figure 13:
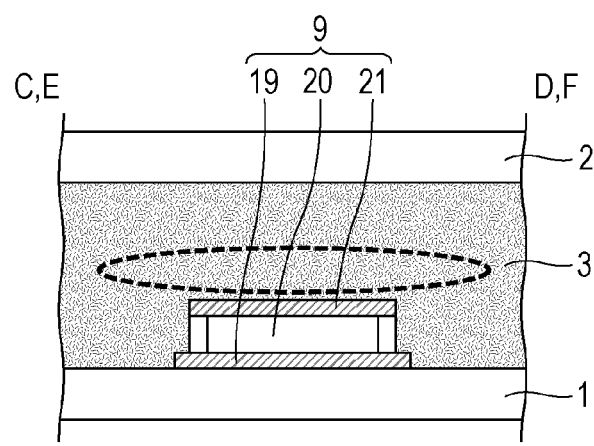
FIG. 13 is a schematic cross-sectional view of the organic EL display device according to the first embodiment and illustrates a cross-sectional structure taken along the line C-D and the line E-F in FIG. 10.

The operation and effects are described further in detail with reference to FIGS. 12 and 13.

FIGS. 12 and 13 are schematic cross-sectional views of the organic EL display device according to the first embodiment. FIG. 12 illustrates a cross-sectional structure taken along the line A-B in FIG. 10 and FIG. 13 illustrates a cross-sectional structure taken along the line C-D and the line E-F in FIG. 10.

As illustrated in FIG. 12, the side portions 22a and 22b of each lead wire 9 are partially covered with the organic insulator 14, not with the sealant 3 generally having poor covering properties. Thus, the organic insulator 14 is also situated under the overhanging portions 23, so that gaps that can occur under the overhanging portions 23 can be reduced in size. This configuration can thus effectively prevent moisture and oxygen from intruding into the sealed region 18 along the side portion 22a or 22b.

Here, most or the entirety of the spaces under the overhanging portions 23 is preferably filled with the organic insulator 14. Specifically, almost no or no clearances are preferably left between the organic insulator 14 and the side portions 22a and 22b of each lead wire 9. This configuration can effectively block each intrusion path for moisture and oxygen along the side portion 22a or 22b, and more reliably prevent intrusion of moisture and oxygen.

As described above, the adhesion of the sealant to the organic insulating film is generally poor and the sealant 3 and the organic insulator 14 are more likely to be separated at the interface therebetween also in this embodiment. Thus, as illustrated in FIG. 12, it is concerned that moisture and oxygen may intrude into the sealed region 18 through a clearance 28 that occurs between the sealant 3 and the organic insulator 14. In this embodiment, however, instead of an organic insulating film that has not been patterned, the patterned organic insulator 14 is disposed. Moreover, the organic insulator 14 is covered with the sealant 3, as illustrated in FIGS. 10 and 13. Thus, the intrusion path between the sealant 3 and the organic insulator 14 can be effectively blocked by the sealant 3. This configuration can thus effectively prevent moisture and oxygen from intruding into the sealed region 18 through the space between the sealant 3 and the organic insulator 14.

Now, the adhesion of the sealant 3 to the organic insulator 14 is further described.

Figure 14:
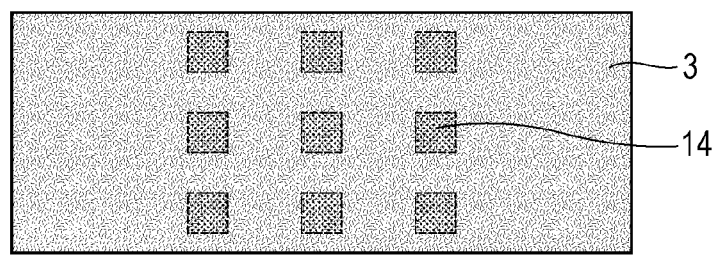
FIG. 14 is a schematic plan view of an organic insulator and a sealant of the organic EL display device according to the first embodiment.
Figure 15:
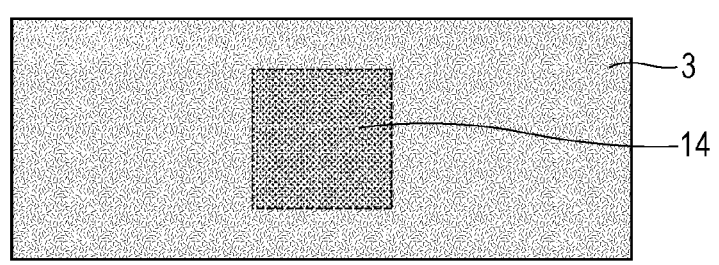
FIG. 15 is a schematic plan view of the organic insulator and the sealant of the organic EL display device according to the first embodiment.
Figure 16:
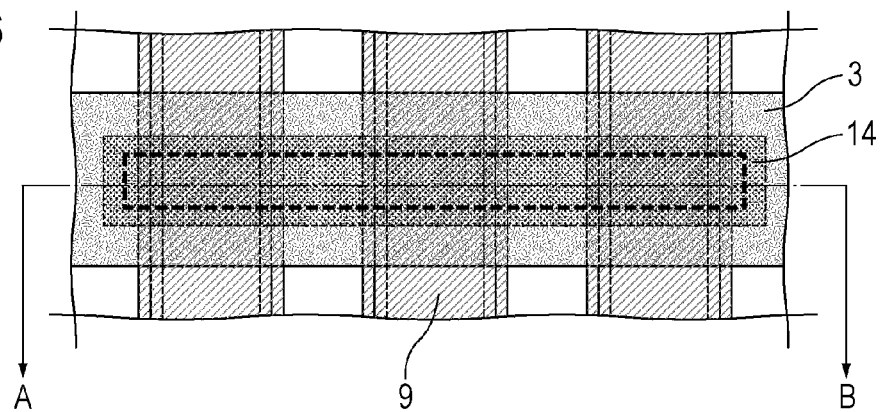
FIG. 16 is a schematic plan view of the organic EL display device according to the first embodiment.
Figure 17:
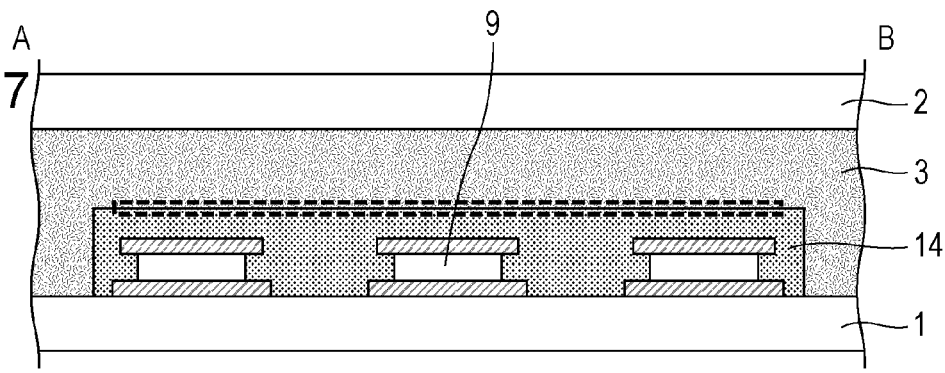
FIG. 17 is a schematic cross-sectional view of the organic EL display device according to the first embodiment and illustrates a cross-sectional structure taken along the line A-B in FIG. 16.

FIGS. 14 and 15 are schematic plan views of the organic insulator and the sealant of the organic EL display device according to the first embodiment. FIG. 16 is a schematic plan view of the organic EL display device according to the first embodiment. FIG. 17 is a schematic cross-sectional view of the organic EL display device according to the first embodiment and illustrates a cross-sectional structure taken along the line A-B in FIG. 16.

The adhesion of the sealant 3 to the organic insulator 14 is assumed to change depending on the pattern of the organic insulator 14. As illustrated in FIG. 15, the adhesion of the organic insulator 14 to the sealant 3 at the middle portion of the organic insulator 14 is assumed to decrease with increasing area of the organic insulator 14, more specifically, increasing lengthwise and widthwise dimensions. This phenomenon possibly relates to the membrane stress. Thus, the separation at the interface between the sealant 3 and the organic insulator 14 is assumed to be less likely to occur with decreasing lengthwise and widthwise dimensions of the organic insulator 14, as illustrated in FIG. 14, and more likely to occur with increasing lengthwise and widthwise dimensions of the organic insulator 14, as illustrated in FIG. 15. In addition, it is assumed that the adhesion of the organic insulator 14 to the sealant 3 improves further toward the edge portion of the organic insulator 14. Thus, in this embodiment, as illustrated in FIGS. 16 and 17, it is assumed that the adhesion between the sealant 3 and the organic insulator 14 is particularly poor at the middle portion (portion surrounded by a broken line) of the organic insulator 14 and thus an intrusion path for moisture and oxygen is likely to be formed at the portion. However, the sealant 3 and the organic insulator 14 are capable of being closely attached to each other at the edge portion of the organic insulator 14, so that it can be expected that the intrusion path for moisture and oxygen can be blocked at the edge portion.

Figure 18:
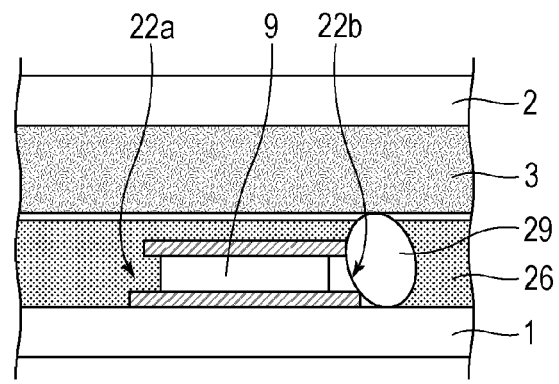
FIG. 18 is a schematic cross-sectional view of the organic EL display device according to the first embodiment and illustrates the case where a particle adheres to a lead wire.
Figure 19:
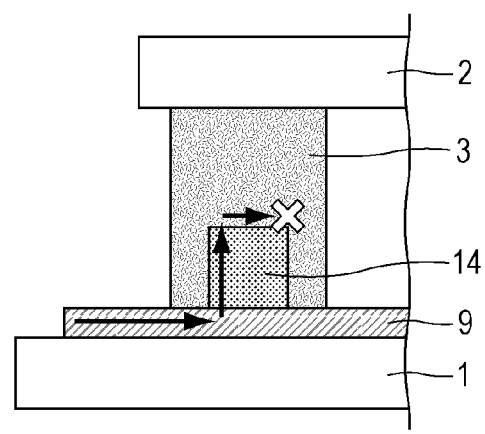
FIG. 19 is a schematic cross-sectional view of the organic EL display device according to the first embodiment and illustrates the case where a particle adheres to a lead wire.

FIGS. 18 and 19 are schematic cross-sectional views of the organic EL display device according to the first embodiment and illustrate the case where a particle adheres to a lead wire.

Also in this embodiment, as in the case of PTL 1, the intrusion path extending along the side portion 22a or 22b of the lead wire 9 may have a portion having insufficient blockage, as illustrated in FIG. 18, due to a cause such as adhesion of a particle 29 to the lead wire 9 during a manufacturing process and the intrusion path may be further connected to an intrusion path between the sealant 3 and the organic insulator 14, as illustrated in FIG. 19. Even in this case, however, the intrusion path can be blocked at the edge portion of the organic insulator 14 since the organic insulator 14 is formed only within the sealant region and covered with the sealant 3. Thus, this embodiment attains a more reliable device than a device formed by the technology described in PTL 1.

Unlike the technology described in PTL 2, this embodiment does not require fine shaping of the side portions 22a and 22b of the lead wire 9. Thus, the selection of the materials and the multilayer structures of the lead wire 9 is widened. Unlike the technology described in PTL 2, this embodiment does not require connection of the lead wire 9 to a wire on the upper layer or the lower layer at or near the sealant 3. Thus, the points at which the lead wire 9 is connected to other wires can be reduced, whereby contact failures can be reduced and the yields can consequently be improved. In addition, the surface treatment for reducing the contact resistance at the contact points can be omitted, whereby the manufacturing processes can be reduced. Furthermore, contact holes used for the lead wire 9 to be connected to other wires can be reduced, whereby the area of the frame region 5 can be reduced.

As described above, this embodiment can attain an organic EL display device that enables size reduction of a frame and that has high reliability and high productivity.

The following describes a method for manufacturing an organic EL display device 101 according to this embodiment. The following mainly describes the case where a top-gate process is adopted as a manufacturing process of the TFT 7, but a bottom-gate process may be adopted, instead. In that case, the processing following the formation of the inter-layer insulating film 10 flows similarly.

Firstly, the first substrate 1 is prepared. The first substrate 1 is an insulating substrate. In the case of a bottom emission device, the first substrate 1 is transparent, whereas in the case of a top emission device, the first substrate 1 may be either transparent or semitransparent. Specific examples include a glass substrate and a plastic substrate.

Subsequently, a base coat layer and a semiconductor layer are formed on the first substrate 1 in this order by a general method.

Then, a gate insulator film is formed by a general method.
Then, a gate wire is formed by a general method.

In the case where the bottom-gate process is adopted, the gate wire may be a wire formed by stacking two or more layers (multilayer wire). Examples of the specific multilayer structure include a Ti—Al—Ti structure, a Mo—Al—Mo structure, a Ti—Cu—Ti structure, and a Mo—Cu—Mo structure. These materials are described in the order of the upper layer, the middle layer, and the lower layer.

In either the top-gate process or the bottom-gate process, one or more electrically conductive films are formed by a method such as sputtering and then photolithography process including wet etching or dry etching is performed so that the one or more electrically conductive films are patterned. Thus, a gate wire is formed.

Subsequently, an inter-inorganic-layer insulating film is formed by a general method. Examples of the material of the inter-inorganic-layer insulating film include silicon oxide, silicon nitride, and silicon oxynitride. The inter-inorganic-layer insulating film may be formed by stacking two or more films one on top of the other. Examples of the method for forming the inter-inorganic-layer insulating film include plasma CVD.

Subsequently, contact holes that pass through the gate insulator film and the inter-inorganic-layer insulating film are formed by a general method such as photolithography.

Thereafter, a source wire and the lead wires 9 are formed. Since the source wire is formed by the same process as the lead wire 9, the source wire has the same multilayer structure. Each layer of the source wire and the lead wires 9 is usually made of an inorganic electrically conductive film. Examples of the material of each layer include metal materials such as aluminum (Al), copper (Cu), silver (Ag), tungsten (W), molybdenum (Mo), titanium (Ti), and tantalum (Ta), compounds of these metal materials (for example, oxides and nitrides), and electrically conductive transparent materials such as indium tin oxide (ITO) and indium zinc oxide (IZO). Examples of a method for depositing each inorganic electrically conductive film include sputtering. After two or more inorganic electrically conductive films are deposited, the photolithography process including wet etching or dry etching is performed so that the two or more inorganic electrically conductive films are patterned. Thus, the source wire and the lead wires 9 are formed. Since the etching rate varies between the two or more inorganic electrically conductive films, the amount by which those films are side-etched during wet etching or dry etching varies. Thus, the side portions 22a and 22b of each lead wire 9 may have an overhanging shape. Specific examples of the multilayer structure of the lead wire 9 include a Ti—Al—Ti structure, a Ti—Cu—Ti structure, a Mo—Al—Mo structure, an ITO-Ag (or Ag alloy)-ITO structure, an IZO-Ag (or Ag alloy)-ITO structure, and an IZO-Al (or Al alloy)-IZO structure. These materials are described in the order of the upper layer, the middle layer, and the lower layer.

Also in the case where the bottom-gate process is adopted, the source wire and the lead wires 9 may have the same structure and material and may be formed by the same method as those in the case where the top-gate process is adopted. Thus, the side portions 22a and 22b of each lead wire 9 may have an overhanging shape also in this case.

The following mainly provides a description assuming the case where each lead wire 9 has a Ti—Al—Ti multilayer structure.

The lead wires 9 may be formed in the process in which the gate wire is formed, not in the process in which the source wire is formed. In the case where a multilayer wire is adopted as a gate wire and the lead wires 9 are formed in the process in which the gate wire is formed, the amount by which the two or more electrically conductive films are side-etched during wet etching or dry etching varies because the etching rate in the photolithography process varies between these films. Thus, particularly in the case where the bottom-gate process is adopted, the side portions 22*a* and 22*b* of the lead wires 9 may have an overhanging shape. This case is described in a second modified example.

Subsequently, the inter-layer insulating film 10 is formed. Examples of the method for forming the inter-layer insulating film 10 include a method including exposure to light and development after applying a photosensitive resin film onto the first substrate 1 by spin coating or slit coating and a method including direct drawing using an inkjet device. Examples of the material of the inter-layer insulating film 10 include acrylic resin, polyimide, phenol resin, and siloxane resin. During development of the inter-layer insulating film 10, the Al layer of each lead wire 9 may be recessed by being damaged by a developing solution and the side portions 22*a* and 22*b* may have an apparent overhanging shape.

After the lead wires 9 are formed and before the inter-layer insulating film 10 is formed, an inter-inorganic-layer insulating film (not illustrated and also referred to as a second inter-inorganic-layer insulating film, below) different from the above-described inter-inorganic-layer insulating film (also referred to as a first inter-inorganic-layer insulating film, below) may additionally be formed. Examples of the second inter-inorganic-layer insulating film include silicon oxide, silicon nitride, and silicon oxynitride. The second inter-inorganic-layer insulating film may be formed by stacking two or more films. Examples of the method for forming the second inter-inorganic-layer insulating film include plasma CVD. Openings are formed in the second inter-inorganic-layer insulating film by a general method such as photolithography. Contact holes that pass through the second inter-inorganic-layer insulating film and the inter-layer insulating film 10 are then formed. The first electrodes 11 are electrically connected with the TFTs 7 through the contact holes. The structure formed in this case is described below as a second modified example.

Subsequently, the first electrodes 11 are formed. In the case of the top emission device, the first electrodes 11 are formed of a reflective film. Examples of the material of the reflective film include metal materials such as Ag and Al and alloys of these metal materials. In the case of the top emission device, the first electrodes 11 may be formed of a multilayer film including a reflective film and a film made of an electrically conductive transparent material such as ITO or IZO (electrically conductive transparent film). Specific examples of the multilayer structure include an IZO-Al-IZO structure, an ITO-Ag-ITO structure, and an IZO-Ag-IZO structure. These materials are described in the order of the upper layer, the middle layer, and the lower layer. Examples of the method for forming the reflective film and the electrically conductive transparent film include sputtering. After one or more such electrically conductive films are formed, photolithography process including wet etching is performed so that the one or more electrically conductive films are patterned. Thus, the first electrode 11 is formed. Patterning of a reflective film made of a Ag-based or Al-based material in the photolithography process involves the use of an etchant such as mixed acid containing phosphoric acid, acetic acid, and nitric acid and an aqueous or solvent removal solution. Thus, the Al layer of each lead wire 9 may be recessed by being damaged by the etchant and the removal solution during etching and resist removal, whereby the side portions 22*a* and 22*b* may have an apparent overhanging shape.

In the case of the top emission device, the lead wires 9 may be formed in the process in which the first electrodes 11 is formed, not in the process in which the source wire is formed. In the case where the first electrodes 11 and the lead wires 9 are concurrently formed from the same multilayer film, the amount by which the two or more electrically conductive films are side-etched during wet etching varies because the etching rate in the photolithography process varies between these films. Thus, in the case of the top emission device and when the lead wires 9 and the first electrodes 11 are concurrently formed from the same multilayer film, the side portions 22*a* and 22*b* of each lead wire 9 may have an overhanging shape.

In the case of the bottom emission device, the first electrodes 11 are formed of an electrically conductive transparent or semitransparent film. Examples of the material of the electrically conductive film include electrically conductive transparent materials such as ITO and IZO. Examples of depositing the electrically conductive film include sputtering. After the electrically conductive film is deposited, the photolithography process including wet etching is performed so that the electrically conductive film is patterned. Thus, the first electrodes 11 are formed. When the electrically conductive film formed of ITO or IZO is patterned in the photolithography process, an etchant such as oxalic acid and an aqueous or solvent removal solution are used. Thus, the Al layer of each lead wire 9 may be recessed by being damaged by the removal solution during resist removal and the side portions 22*a* and 22*b* may have an apparent overhanging shape.

Subsequently, the edge cover 12 is formed. Examples of the method for forming the edge cover 12 include a method including exposure to light and development after applying a photosensitive resin film onto the first substrate 1 by spin coating or slit coating and a method including direct drawing using an inkjet device. Examples of the material of the edge cover 12 include acrylic resin, polyimide, phenol resin, and siloxane resin. During development of the edge cover 12, an Al layer of each lead wire 9 may be recessed by being damaged by a developing solution and the side portions 22*a* and 22*b* may have an apparent overhanging shape.

Subsequently, the organic insulator 14 is formed. The organic insulator 14 is made of an organic insulating material. Examples of the method for forming the organic insulator 14 include a method including exposure to light and development after applying a photosensitive resin film onto the first substrate 1 by spin coating or slit coating and a method including direct drawing using an inkjet device. Examples of the material of the organic insulator 14 include acrylic resin, polyimide, phenol resin, and siloxane resin.

The film thickness of the organic insulator 14 is preferably greater than or equal to the film thickness of the lead wires 9. This configuration allows the side portions 22*a* and 22*b* of the lead wires 9 to be sufficiently covered. Specifically, the film thickness of the organic insulator 14 preferably falls within the range of approximately from 1 μm to 5 μm.

Since there is a need to prevent the intrusion of moisture and oxygen into the sealant 3, the width of the organic insulator 14 (dimension in which the lead wire 9 extends) is set smaller than the width of the sealant. Specifically, the width of the organic insulator 14 preferably falls within the range of approximately from 2 μm to 500 μm. The width of the organic insulator 14 may be or may not be uniform. In other words, the width of the organic insulator 14 may change in the longitudinal direction of the organic insulator 14.

In this embodiment, the accuracy required for patterning the organic insulator 14 is lower and introduction of an inkjet device for patterning the organic insulator 14 is easier than in the case where a pattern is formed within the display region 6. Thus, a material having a low moisture permeability and that is different from the material of other insulating layers can be used as the material of the organic insulator 14. In this embodiment, the element deterioration can be more effectively inhibited than in the case of the fourth embodiment, described below.

Subsequently, layers forming the EL layer 15 are sequentially formed. Each layer of the EL layer 15 is usually formed so as to cover the display region 6 by a method such as mask vapor deposition and thus etching is not required here. The material of each layer of the EL layer 15 is not limited to a particular one and can be appropriately selected from general materials.

Subsequently, the second electrode 16 is formed. This formation of the second electrode 16 completes the organic EL element 17. The second electrode 16 is usually formed so as to cover the display region 6 by a method such as mask vapor deposition and thus etching is not required here.

In the case of a top emission device, the second electrode 16 is formed of a transparent or semitransparent electrically conductive film. Examples of the material of this electrically conductive film include electrically conductive transparent materials such as ITO and IZO.

In the case of a bottom emission device, the second electrode 16 is formed of a reflective film. Examples of the material of the reflective film include metal materials such as Ag and Al and alloys of these metal materials. In the case of the bottom emission device, the second electrode 16 may be formed of a multilayer film including a reflective film and a film made of an electrically conductive transparent material such as ITO or IZO (electrically conductive transparent film).

Subsequently, the first substrate 1 on which the organic EL element 17 is disposed and the second substrate 2 are bonded together using a sealant, so that the organic EL element 17 is sealed.

Finally, a process for mounting a mount component is performed, so that the organic EL display device 101 according to this embodiment is finished.

Figure 20:
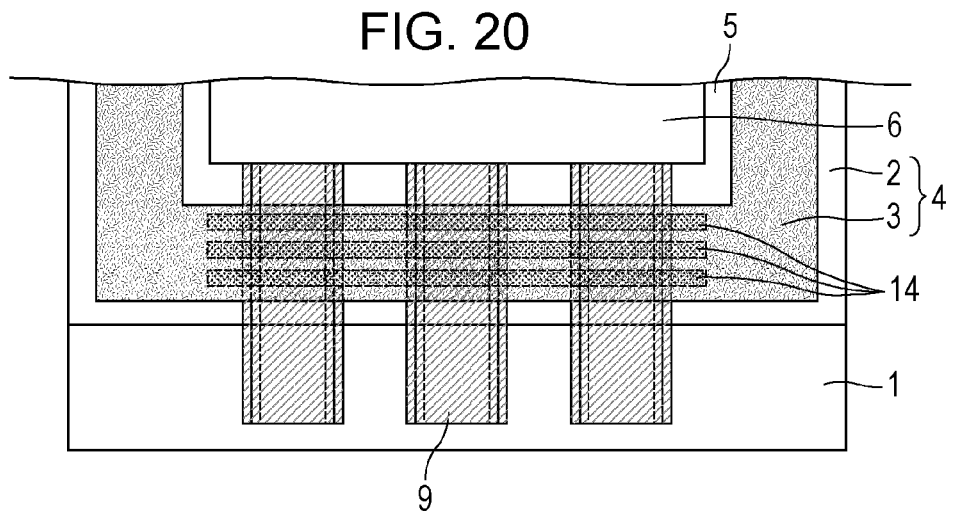
FIG. 20 is a schematic plan view of a first modified example of the organic EL display device according to the first embodiment.
Figure 21:
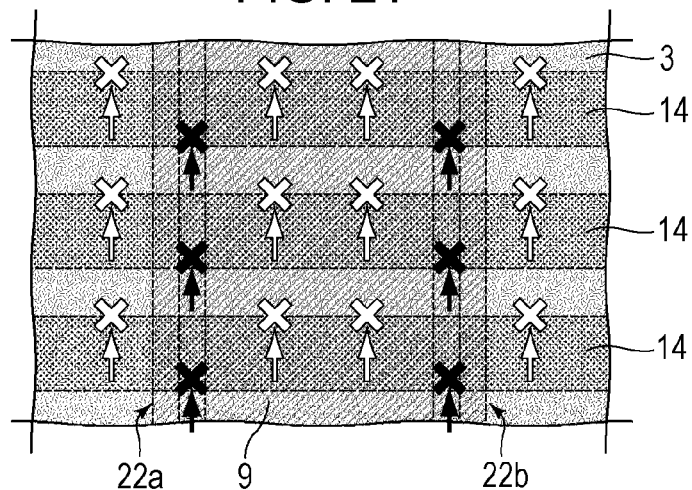
FIG. 21 is a schematic plan view of a first modified example of the organic EL display device according to the first embodiment.

FIGS. 20 and 21 are schematic plan views of a first modified example of the organic EL display device according to the first embodiment. In FIG. 21, the arrows indicate intrusion paths of moisture and oxygen and the cross marks indicate the block points on the intrusion paths.

In this modified example, as illustrated in FIG. 20, multiple organic insulators 14 are formed into a pattern of multiple lines (strips). Each organic insulator 14 crosses the multiple lead wires 9. As illustrated in FIG. 21, each of the intrusion paths (see solid arrows and cross marks) extending along the side portion 22a or 22b of the lead wire 9 and each of the intrusion paths (see solid-white arrows and cross marks) between the sealant 3 and the organic insulating film 26 become more likely to be blocked with increasing number of organic insulators 14, whereby the element deterioration can be more effectively inhibited. Specifically, this modified example can attain a more reliable organic EL display device compared to the case where only one organic insulator 14 is provided.

Figure 45:
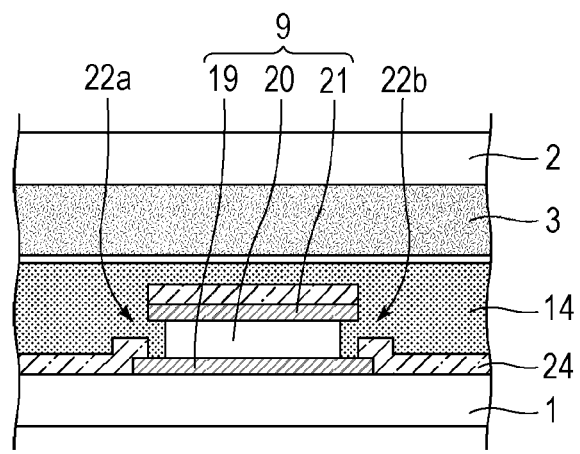
FIG. 45 is a schematic cross-sectional view of a second modified example of the organic EL display device according to the first embodiment.

FIG. 45 is a schematic cross-sectional view of a second modified example of the organic EL display device according to the first embodiment.

In this modified example, (1) the lead wires 9 are formed in the process in which the gate wire is formed, not in the process in which the source wire is formed, or (2) the lead wires 9 are formed in the process in which the source wire is formed. Then, a second inorganic insulating film is formed over the lead wires 9. Thus, as illustrated in FIG. 45, a first or second inter-inorganic-layer insulating film 24 is formed over the lead wires 9. The inter-inorganic-layer insulating film 24 has almost no effect of flattening the steps in the pattern underlying the inter-layer insulating film 24. Thus, if the film thickness of the inter-inorganic-layer insulating film 24 is insufficient, the coverage of the inter-inorganic-layer insulating film 24 may be insufficient at or near the side portions 22a and 22b. However, a gap that can occur at or near the insufficient coverage portion of the inter-inorganic-layer insulating film 24 can be filled with the organic insulator 14 on the inter-inorganic-layer insulating film 24. Thus, the intrusion path extending along the side portion 22a or 22b of the lead wire 9 can be blocked also in this modified example.

In the above-described case (1), the inter-inorganic-layer insulating film 24 may be removed in the sealant region at the time of forming contact holes passing through the gate insulator film and the inter-inorganic-layer insulating film 24. In the above-described case (2), the inter-inorganic-layer insulating film 24 may be removed in the sealant region at the time of forming openings. Thus, the organic insulator 14 may be located immediately above the lead wires 9 as in the above-described case.

Second Embodiment

Except for the organic insulator having a different pattern, this embodiment is substantially the same as the first embodiment. Thus, the characteristics unique to this embodiment are mainly described in this embodiment and portions that are the same as those in the first embodiment are not described. Throughout this embodiment and the first embodiment, components having the same or similar functions are denoted by the same symbols and are not described in this embodiment.

Figure 22:
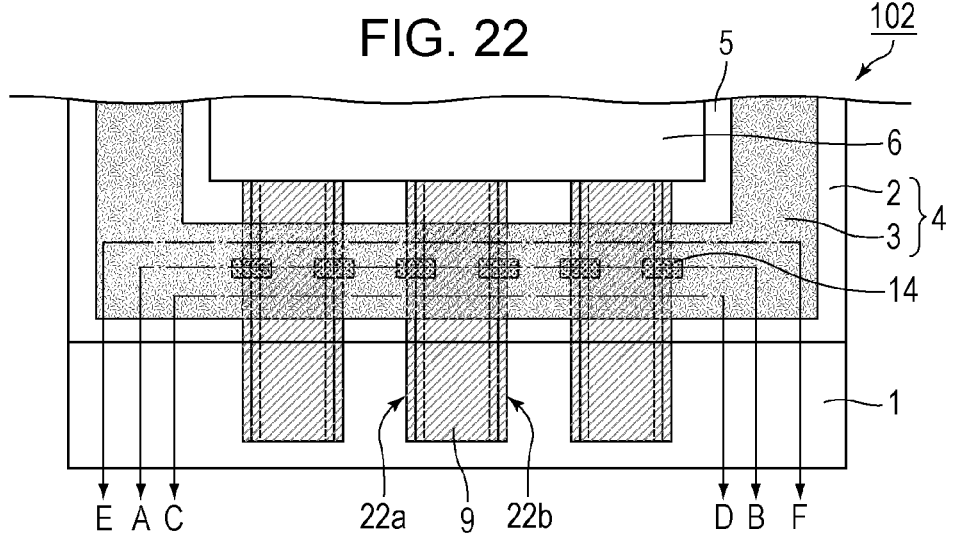
FIG. 22 is a schematic plan view of the organic EL display device according to a second embodiment.
Figure 23:
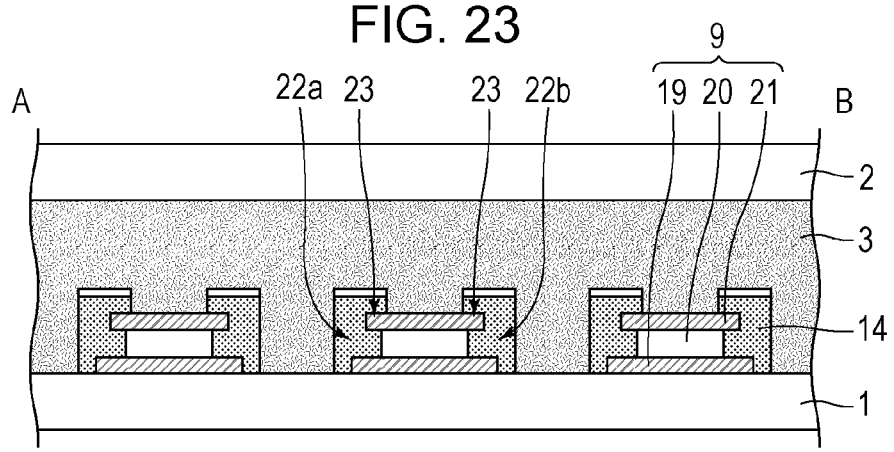
FIG. 23 is a schematic cross-sectional view of the organic EL display device according to the second embodiment and illustrates a cross-sectional structure taken along the line A-B in FIG. 22.
Figure 24:
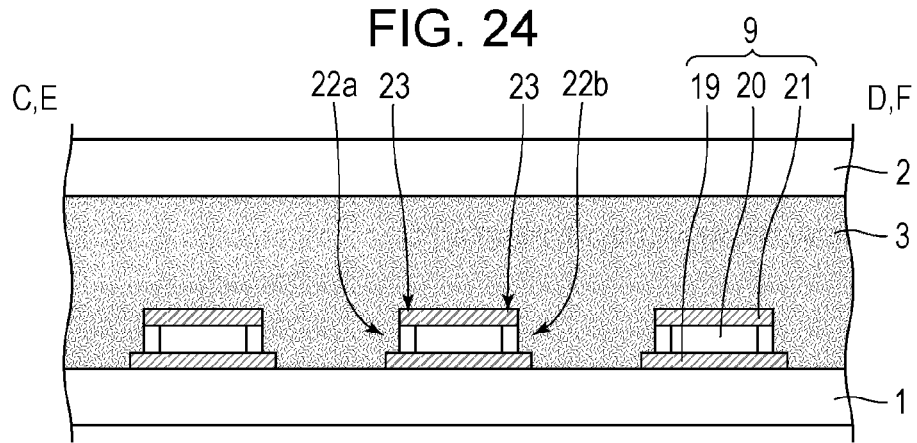
FIG. 24 is a schematic cross-sectional view of the organic EL display device according to the second embodiment and illustrates a cross-sectional structure taken along the line C-D and the line E-F in FIG. 22.

FIG. 22 is a schematic plan view of an organic EL display device according to the second embodiment. FIGS. 23 and 24 are schematic cross-sectional views of the organic EL display device according to the second embodiment. FIG. 23 illustrates a cross-sectional structure taken along the line A-B in FIG. 22. FIG. 24 illustrates a cross-sectional structure taken along the line C-D and the line E-F in FIG. 22.

As illustrated in FIGS. 22 to 24, an organic EL display device 102 according to the embodiment includes multiple organic insulators 14. Each organic insulator 14 is formed in an island form (dot-like form). The patterned organic insulators 14 are individually disposed on the side portions 22a and 22b of each lead wire 9. The multiple organic insulators 14 are located in a scattered manner and each organic insulator 14 covers part of the side portion 22a or 22b underlying the organic insulator 14. Each organic insulator 14 is covered with the sealant 3.

The film thickness of the organic insulator 14 is preferably greater than or equal to the film thickness of the lead wire 9. This configuration allows the side portions 22a and 22b of the lead wire 9 to be sufficiently covered. Specifically, the film thickness of the organic insulator 14 preferably falls within the range of approximately from 1 μm to 5 μm.

Since there is a need to prevent the intrusion of moisture and oxygen into the sealant 3, the width of the organic insulator 14 (dimension in which the lead wire 9 extends) is set smaller than the width of the sealant. Specifically, the width of the organic insulator 14 preferably falls within the range of approximately from 2 μm to 500 μm. The size of the multiple organic insulators 14 may be the same or different.

Figure 25:
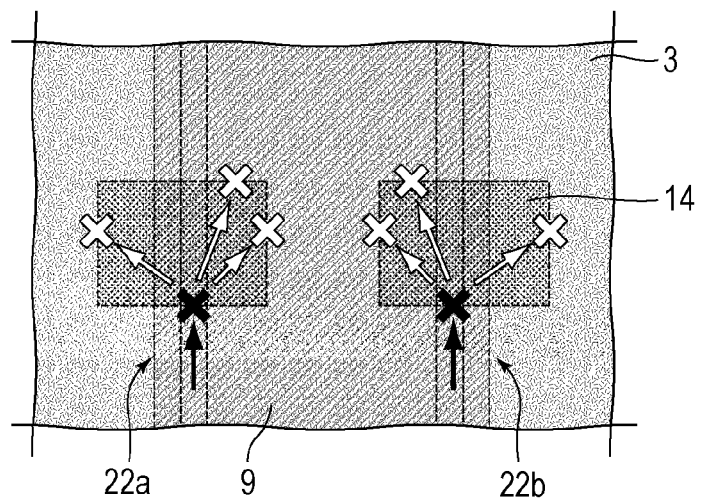
FIG. 25 is a schematic plan view of the organic EL display device according to the second embodiment.

FIG. 25 is a schematic plan view of the organic EL display device according to the second embodiment. In FIG. 25, the arrows indicate the intrusion paths for moisture and oxygen and the cross marks indicate the block points on the intrusion paths.

In this embodiment, each organic insulator 14 is disposed in an island form (dot-like form). Each organic insulator 14 covers part of one of the two opposite side portions 22a and 22b of the corresponding lead wire 9 and does not cover the other side portion. Thus, as illustrated in FIG. 25, the configuration according to this embodiment can have more points at which and a larger area over which the intrusion path for moisture and oxygen between the sealant 3 and the organic insulator 14 can be blocked than in the case of the first embodiment (see solid-white arrows and cross marks). The configuration according to this embodiment thus more reliably blocks this intrusion path than in the case of the first embodiment. Each intrusion path extending along the side portion 22a or 22b of the lead wire 9 is blocked as in the case of the first embodiment (see solid arrows and cross marks). In this manner, the element deterioration can be more effectively inhibited in this embodiment than in the case of the first embodiment.

Figure 26:
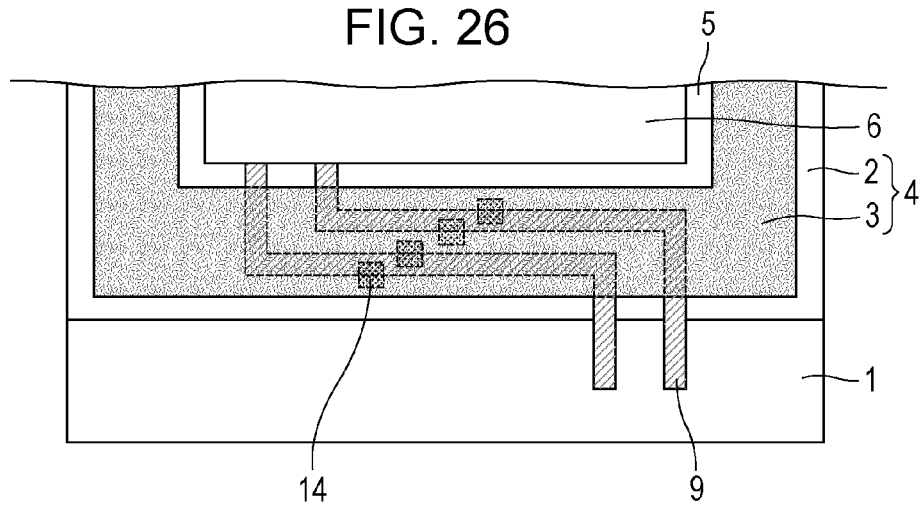
FIG. 26 is a schematic plan view of a first modified example of the organic EL display device according to the second embodiment.

FIG. 26 is a schematic plan view of a first modified example of the organic EL display device according to the second embodiment.

In this modified example, part of each lead wire 9 does not cross the sealant 3 and is formed, for example, so as extend along the sealant 3, as illustrated in FIG. 26. Even in such a case, forming multiple organic insulators 14 in an island form can achieve the same effects as in the case illustrated in FIG. 22 without producing a complex layout design.

Figure 27:
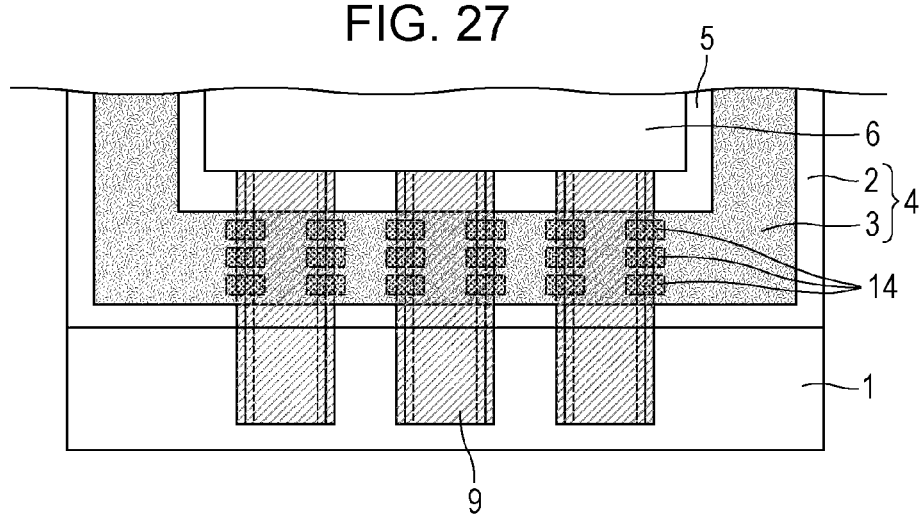
FIG. 27 is a schematic plan view of a second modified example of the organic EL display device according to the second embodiment.
Figure 28:
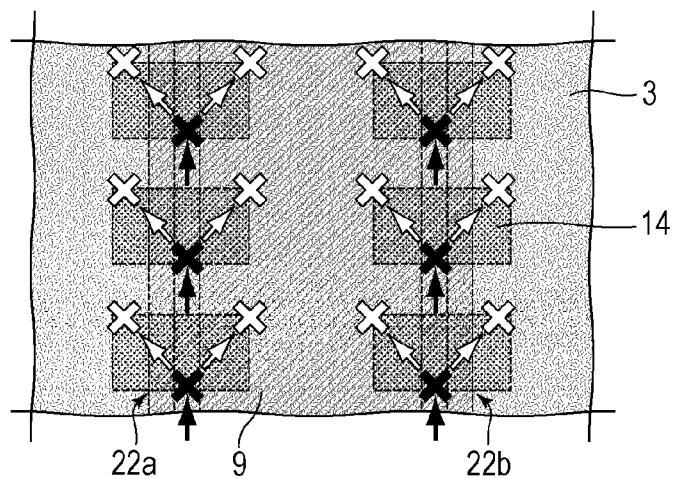
FIG. 28 is a schematic plan view of the second modified example of the organic EL display device according to the second embodiment.

FIGS. 27 and 28 are schematic plan views of a second modified example of the organic EL display device according to the second embodiment. In FIG. 28, the arrows indicate the intrusion paths for moisture and oxygen and the cross marks indicate the block points on the intrusion paths.

In this modified example, as illustrated in FIG. 27, multiple island-like (dot-like) organic insulators 14 are formed on each of the side portions 22a and 22b of the lead wire 9. Each organic insulator 14 covers part of the side portion 22a or 22b underlying the organic insulator 14.

As illustrated in FIG. 28, each of the intrusion paths (see solid arrows and cross marks) extending along the side portion 22a or 22b of the lead wire 9 and each of the intrusion paths (see solid-white arrows and cross marks) between the sealant 3 and the organic insulating film 26 become more likely to be blocked with increasing number of organic insulators 14, whereby the element deterioration can be more effectively inhibited.

Figure 46:
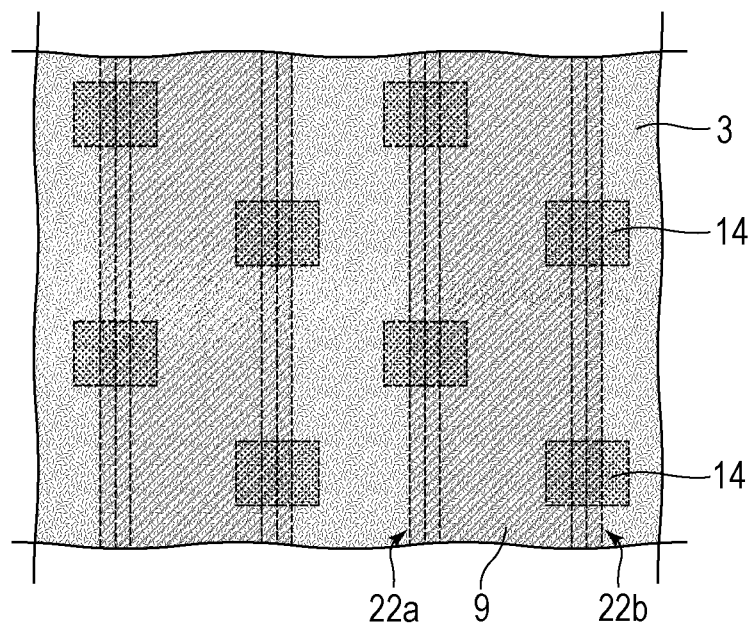
FIG. 46 is a schematic plan view of a third modified example of the organic EL display device according to the second embodiment.

FIG. 46 is a schematic plan view of a third modified example of the organic EL display device according to the second embodiment.

In this modified example, the multiple organic insulators 14 are formed in a staggered manner and alternately arranged as illustrated in FIG. 46. This configuration allows the distance between adjacent organic insulators 14 to be increased compared to the cases illustrated in FIGS. 22 and 27, whereby connection between adjacent organic insulators 14, that is, occurrence of patterning failures of the organic insulators 14 can be prevented. This configuration can thus more reliably bring about an effect of the second embodiment with which the element deterioration is effectively inhibited.

Third Embodiment

Except for the sealing member having a different structure, this embodiment is substantially the same as the first embodiment. Thus, the characteristics unique to this embodiment are mainly described in this embodiment and portions that are the same as those in the first embodiment are not described. Throughout this embodiment and the first embodiment, components having the same or similar functions are denoted by the same symbols and are not described in this embodiment.

Figure 29:
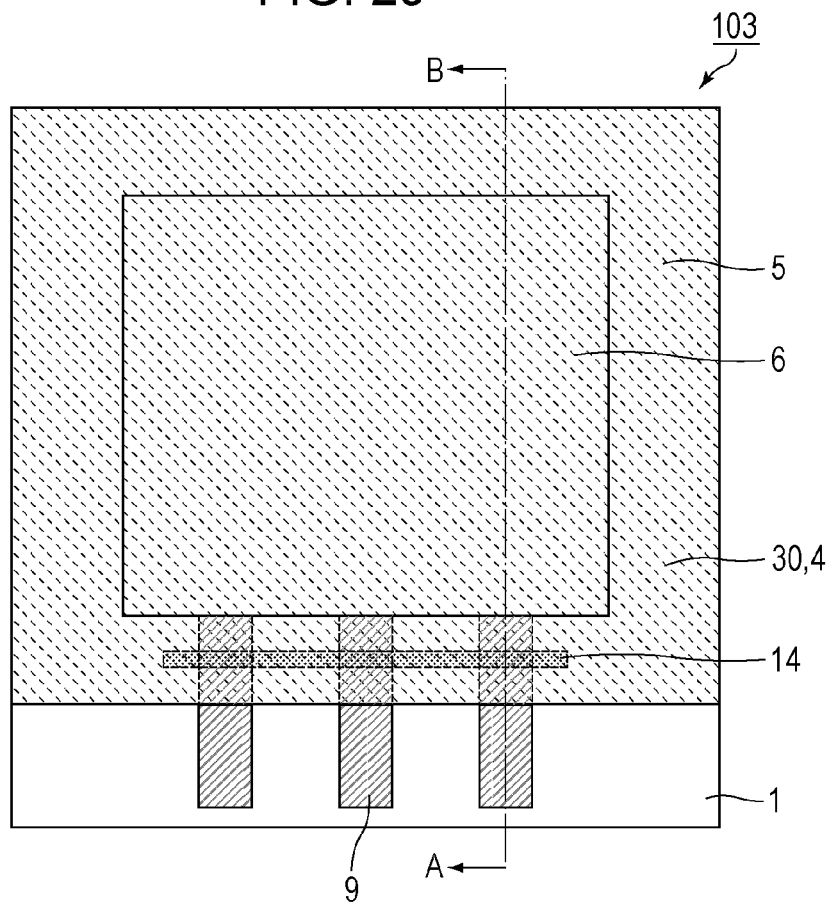
FIG. 29 is a schematic plan view of an organic EL display device according to a third embodiment.
Figure 30:
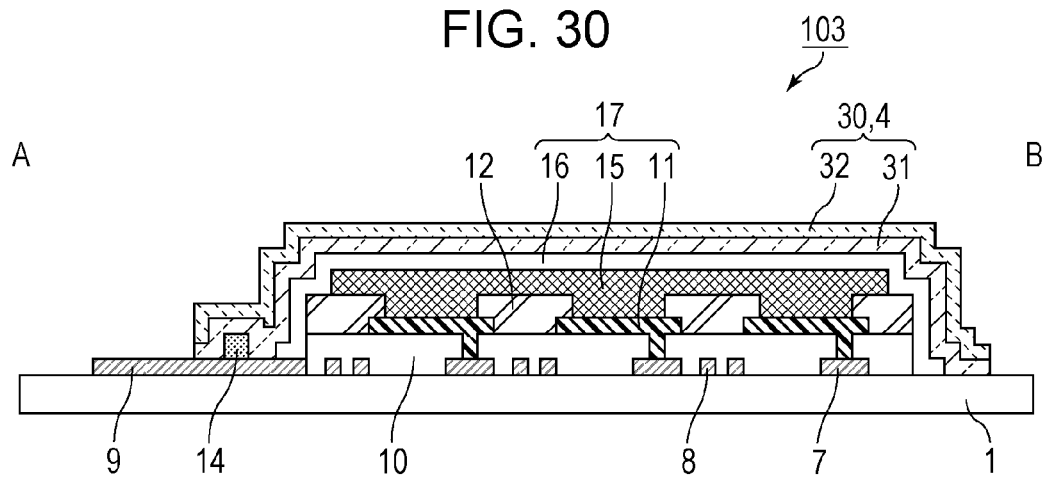
FIG. 30 is a schematic cross-sectional view of the organic EL display device according to the third embodiment and illustrates a cross-sectional structure taken along the line A-B in FIG. 29.
Figure 31:
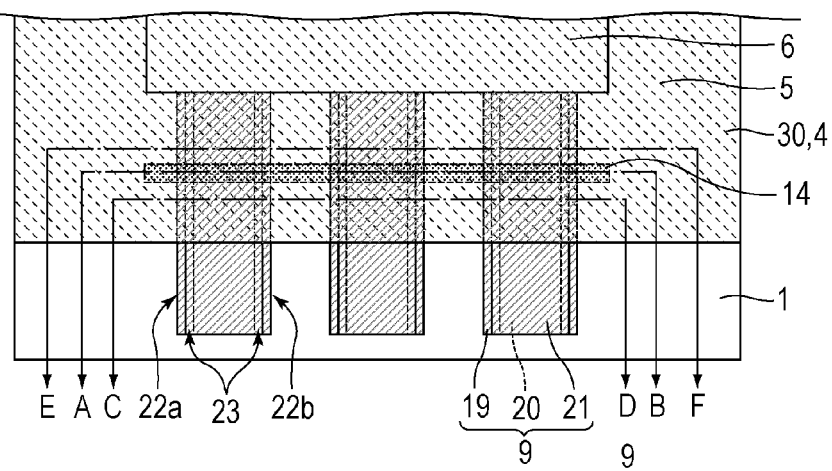
FIG. 31 is a schematic plan view of the organic EL display device according to the third embodiment.
Figure 32:
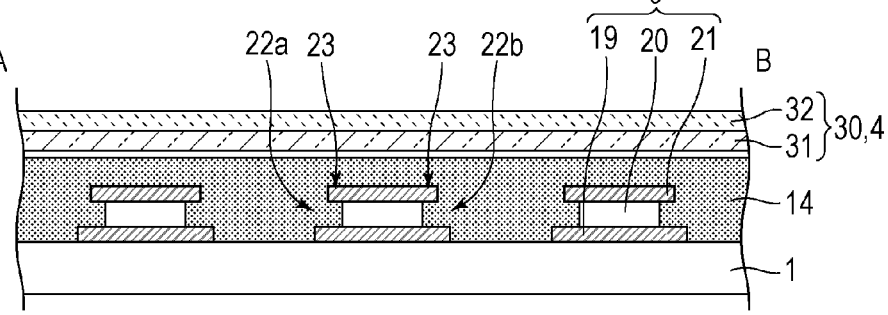
FIG. 32 is a schematic cross-sectional view of the organic EL display device according to the third embodiment and illustrates a cross-sectional structure taken along the line A-B in FIG. 31.
Figure 33:
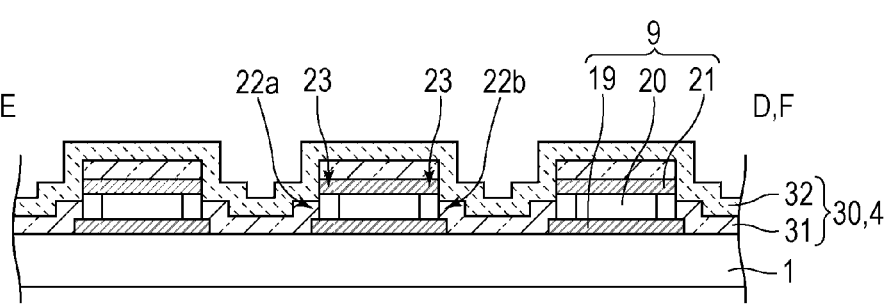
FIG. 33 is a schematic cross-sectional view of the organic EL display device according to the third embodiment and illustrates a cross-sectional structure taken along the line C-D and the line E-F in FIG. 31.

FIGS. 29 and 31 are schematic plan views of the organic EL display device according to the third embodiment. FIGS. 30, 32, and 33 are schematic cross-sectional views of the organic EL display device according to the third embodiment. FIG. 30 illustrates a cross-sectional structure taken along the line A-B in FIG. 29. FIG. 32 illustrates a cross-sectional structure taken along the line A-B in FIG. 31. FIG. 33 illustrates a cross-sectional structure taken along the line C-D and the line E-F in FIG. 31.

As illustrated in FIGS. 29 to 33, an organic EL display device 103 according to the third embodiment includes a barrier film 30 serving as the sealing member 4 instead of the second substrate 2 and the sealant 3.

The sealed region surrounded with the first substrate 1 and the barrier film 30 is sealed with the first substrate 1 and the barrier film 30. The organic EL element 17 disposed in the sealed region is also sealed with the first substrate 1 and the barrier film 30. This configuration prevents moisture and oxygen from intruding into the sealed region from the outside and inhibits deterioration of the organic EL element 17.

The barrier film 30 is formed over the first substrate 1 except for a mount region over which terminals are disposed and a mount component is mounted (terminal region). The barrier film 30 completely covers the display region 6 and a large part of the first substrate 1. In addition, the barrier film 30 covers the entirety of the organic insulator 14 formed on the lead wires 9.

The barrier film 30 has a multi-layer structure in which two or more insulator films are stacked. For example, the barrier film 30 includes a lower layer film 31 and an upper layer film 32 stacked on the lower layer film 31, as illustrated in FIG. 30. The lower layer film 31, which is a lowermost layer of the barrier film 30, is formed of an inorganic insulating film. Examples of the specific multilayer structure of the barrier film 30 include an inorganic insulating film-organic insulating film-inorganic insulating film structure (three-layer structure) and an inorganic insulating film-organic insulating film-inorganic insulating film-organic insulating film-inorganic insulating film structure (five-layer structure).

Examples of the material of the barrier film 30, that is, each insulator film include an inorganic insulating material and an organic insulating material. Examples of the inorganic insulating material include silicon oxide, silicon nitride, silicon oxynitride, and aluminium oxide. Examples of the organic insulating material include acrylic resin and polyimide. Examples of the method for depositing the inorganic insulating film include plasma CVD and sputtering. The inorganic insulating film deposited by such methods has almost no effect of flattening the steps of the pattern underlying the inorganic insulating film. Thus, as illustrated in FIG. 33, if the film thickness of the lower layer film 31 is insufficient and the shape of the side portions 22a and 22b of the lead wire 9 is distorted, the coverage of the lower layer film 31 of the barrier film 30 may be insufficient at or near the side portions 22*a* and 22*b*. However, the insufficient coverage portion can be covered with the second layer or subsequent film, for example, the upper layer film 32. Thus, the barrier film 30 as a whole can function as the sealing member 4 without any problem. Examples of the method for depositing an organic insulating film include an application method including spin coating or slit coating.

Hereinbelow, before describing the operation and the effects according to the embodiment, third and fourth comparative examples that the inventors have examined are described.

Figure 34:
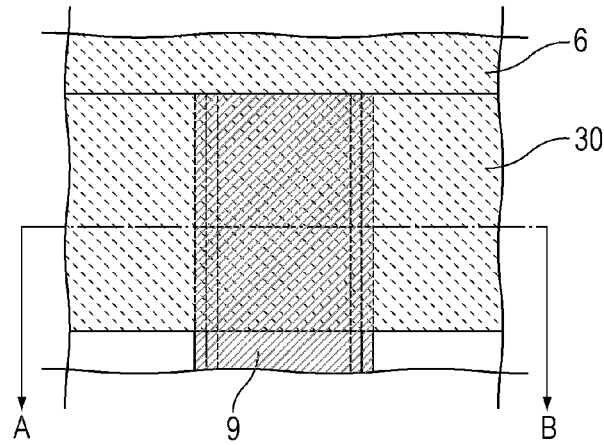
FIG. 34 is a schematic plan view of an organic EL display device according to a third comparative example.
Figure 35:
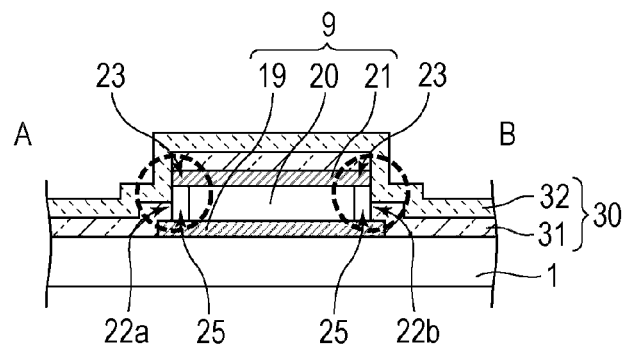
FIG. 35 is a schematic cross-sectional view of the organic EL display device according to the third comparative example and illustrates a cross-sectional structure taken along the line A-B in FIG. 34.

FIG. 34 is a schematic plan view of the organic EL display device according to the third comparative example. FIG. 35 is a schematic cross-sectional view of the organic EL display device according to the third comparative example and illustrates a cross-sectional structure taken along the line A-B in FIG. 34.

In this comparative example, as illustrated in FIG. 34, only a barrier film 30 is disposed on the lead wire 9 without the organic insulator 14 being disposed on the lead wire 9. Thus, as illustrated in FIG. 35, the lower layer film 31 of the barrier film 30 fails to cover the side portions 22*a* and 22*b* distorted into an overhanging shape and the lower layer film 31 is not filled into the spaces under the overhanging portions 23 of the upper layer 21 of the lead wire 9. Consequently, gaps 25 occur between the barrier film 30 and the side portions 22*a* and 22*b* of the lead wire 9. The gaps 25 particularly occur between the middle layer 20 of the lead wire 9 and the barrier film 30. Thus, paths for moisture and oxygen to intrude into the sealed region are formed along the side portions 22*a* and 22*b*.

Figure 36:
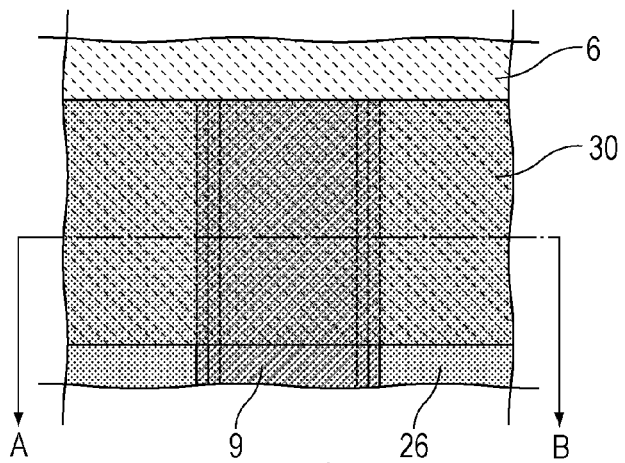
FIG. 36 is a schematic plan view of an organic EL display device according to a fourth comparative example.
Figure 37:
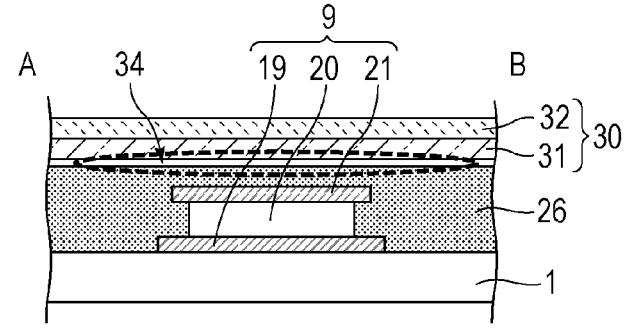
FIG. 37 is a schematic cross-sectional view of the organic EL display device according to the fourth comparative example and illustrates a cross-sectional structure taken along the line A-B in FIG. 36.

FIG. 36 is a schematic plan view of an organic EL display device according to the fourth comparative example. FIG. 37 is a schematic cross-sectional view of an organic EL display device according to the fourth comparative example and illustrates a cross-sectional structure taken along the line A-B in FIG. 36.

In this comparative example, as illustrated in FIG. 36, an organic insulating film 26 that has not been subjected to patterning is formed under the edge portion of the barrier film 30. Generally, the adhesion of the inorganic insulating film included in the barrier film to the organic insulator is poor and thus the lower layer film 31 of the barrier film 30 and the organic insulating film 26 are likely to be separated at the interface between the lower layer film 31 and the organic insulating film 26 and a clearance 34 occurs between the lower layer film 31 and the organic insulating film 26. Thus, a path for moisture and oxygen to intrude into the sealed region is formed between the barrier film 30 and the organic insulating film 26.

Figure 38:
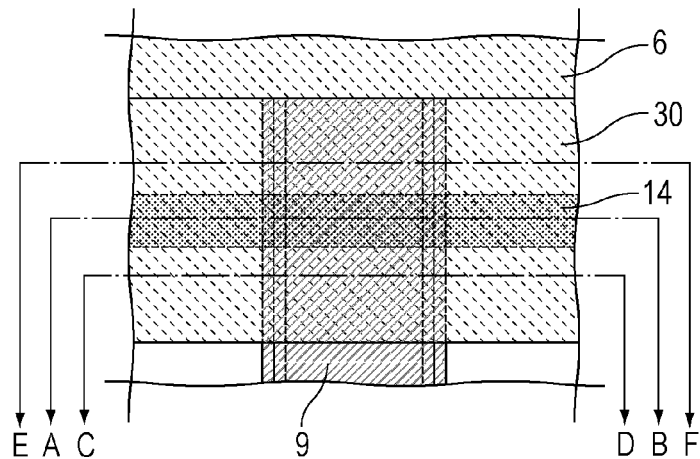
FIG. 38 is a schematic plan view of the organic EL display device according to the third embodiment.
Figure 39:
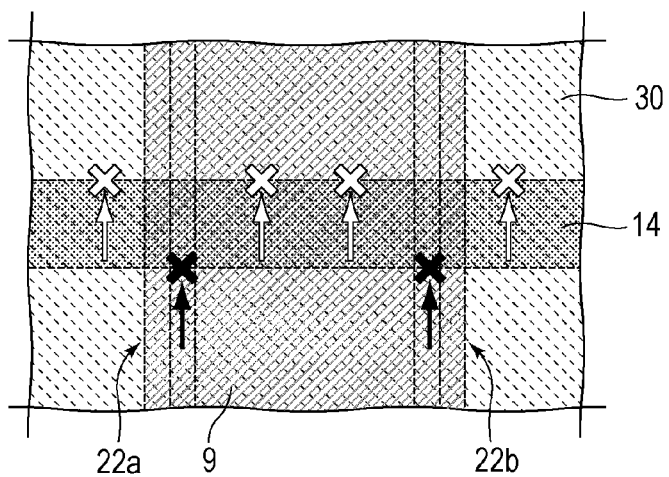
FIG. 39 is a schematic plan view of the organic EL display device according to the third embodiment.
Figure 40:
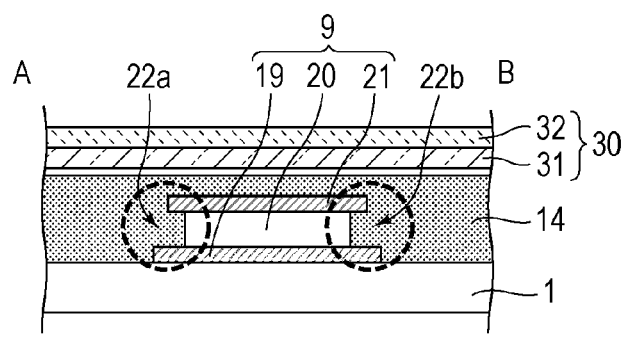
FIG. 40 is a schematic cross-sectional view of the organic EL display device according to the third embodiment and illustrates a cross-sectional structure taken along the line A-B in FIG. 38.
Figure 41:
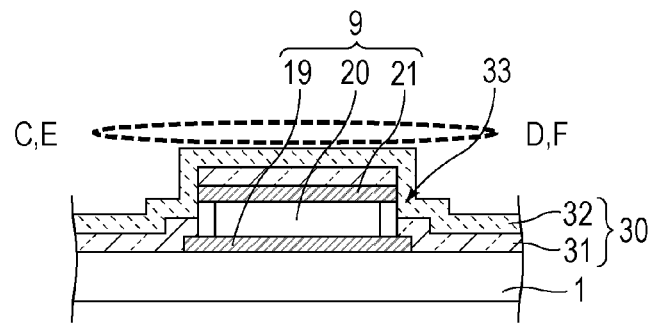
FIG. 41 is a schematic cross-sectional view of the organic EL display device according to the third embodiment and illustrates a cross-sectional structure taken along the line C-D and the line E-F in FIG. 38.

FIGS. 38 and 39 are schematic plan views of the organic EL display device according to the third embodiment. In FIG. 39, the arrows indicate the intrusion paths for moisture and oxygen and the cross marks indicate the block points on the intrusion paths. FIGS. 40 and 41 are schematic cross-sectional views of the organic EL display device according to the third embodiment. FIG. 40 illustrates a cross-sectional structure taken along the line A-B in FIG. 38 and FIG. 41 illustrates a cross-sectional structure taken along the line C-D and the line E-F in FIG. 38.

In this embodiment, as illustrated in FIG. 38, the lead wire 9 has a portion covered with the organic insulator 14 and portions left without being covered with the organic insulator 14. Thus, as illustrated in FIGS. 39 and 40, each of the intrusion paths extending along the side portion 22*a* or 22*b* of the lead wire 9 is blocked at the portion covered with the organic insulator 14 (see solid arrows and cross marks). At the portions left without being covered with the organic insulator 14, the intrusion paths between the sealant 3 and the organic insulator 14 are blocked (see solid-white arrows and cross marks), as illustrated in FIGS. 39 and 41. In this manner, the likelihood of moisture and oxygen intruding into the sealed region can be reduced, whereby degradation of the organic EL element can be inhibited.

As illustrated in FIG. 41, insufficient coverage portions 33 of the lower layer film 31 are formed on the outer side of the organic insulator 14 and between the organic insulator 14 and the display region 6 (on the inner side of the organic insulator 14) and can form intrusion paths for moisture and oxygen. However, the organic insulator 14 is capable of blocking the intrusion of moisture and oxygen in the manner as described above, even when moisture and oxygen intrude along the insufficient coverage portion 33 on the outer side. Moreover, since the insufficient coverage portion 33 on the inner side is covered with the upper layer film 32, the intrusion of moisture and oxygen from above the barrier film 30 can also be prevented. Thus, these insufficient coverage portions 33 do not particularly cause any problem.

As in the case of the first embodiment, this embodiment can attain an organic EL display device that enables size reduction of a frame and that has high reliability and high productivity.

In the case where the barrier film 30 includes an organic insulating film, the organic insulating film is formed over the entire area of the first substrate 1 except for the mount region and thus unable to substitute for the organic insulator 14.

Figure 47:
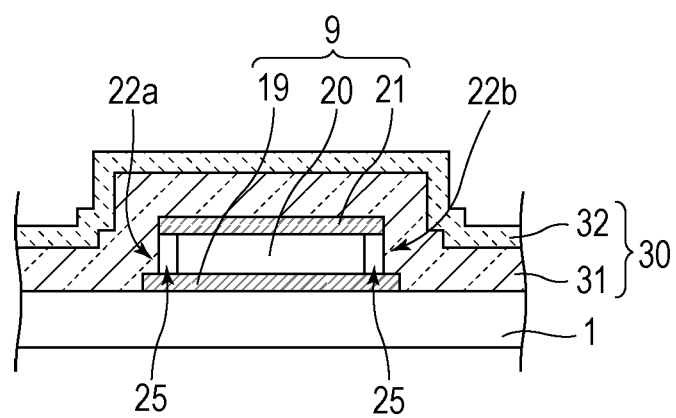
FIG. 47 is a schematic cross-sectional view of a modified example of the organic EL display device according to the third embodiment.

FIG. 47 is a schematic cross-sectional view of a modified example of the organic EL display device according to the third embodiment.

In this modified example, as illustrated in FIG. 47, the lower layer film 31 of the barrier film 30 has a large film thickness. Thus, the lower layer film 31 causes no coverage failure at or near the side portions 22*a* and 22*b*. In this case, however, gaps 25 occur between the lower layer film 31 and the side portions 22*a* and 22*b* of the lead wire 9. Thus, the above-described organic insulator (not illustrated in FIG. 47) is disposed in order to block the intrusion path extending along the side portion 22*a* or 22*b* of the lead wire 9. Thus, the likelihood of moisture and oxygen intruding into the sealed region can be reduced, whereby degradation of the organic EL element can be inhibited.

In this modified example, with the presence of the lower layer film 31, the organic insulating film fails to fill into the gaps 25 even by stacking the organic insulating film on the lower layer film 31. Thus, also in this modified example, the organic insulating film of the barrier film 30 is unable to substitute for the organic insulator 14.

Fourth Embodiment

Except for the organic insulator having a different material and formed by a different production flow, this embodiment is substantially the same as the first embodiment. Thus, the characteristics unique to this embodiment are mainly described in this embodiment and portions that are the same as those in the first embodiment are not described. Throughout this embodiment and the first embodiment, components having the same or similar functions are denoted by the same symbols and are not described in this embodiment.

Figure 42:
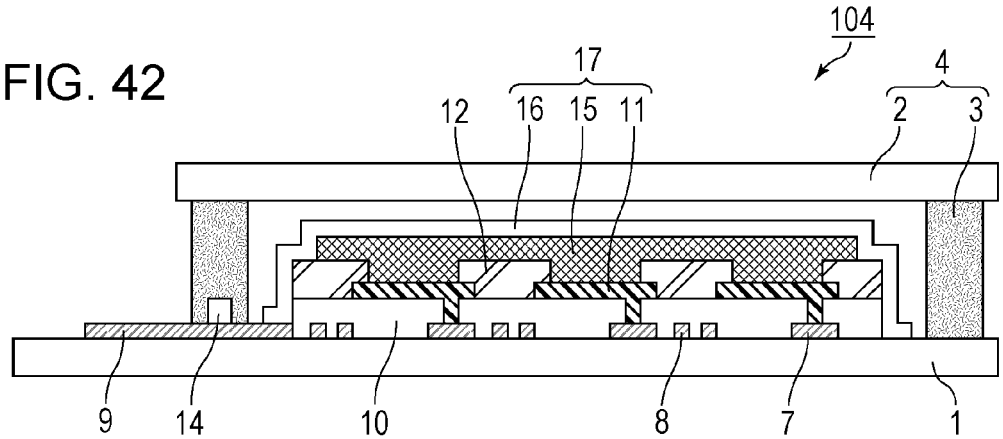
FIG. 42 is a schematic cross-sectional view of an organic EL display device according to a fourth embodiment.
Figure 43:
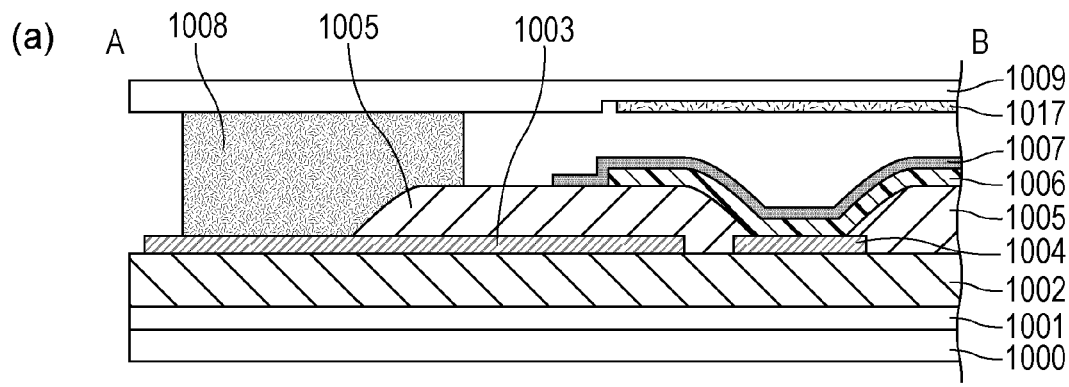
FIGS. 43 (a) to 43(c) are schematic diagrams of the light emitting device described in PTL 1, where
Figure 43:
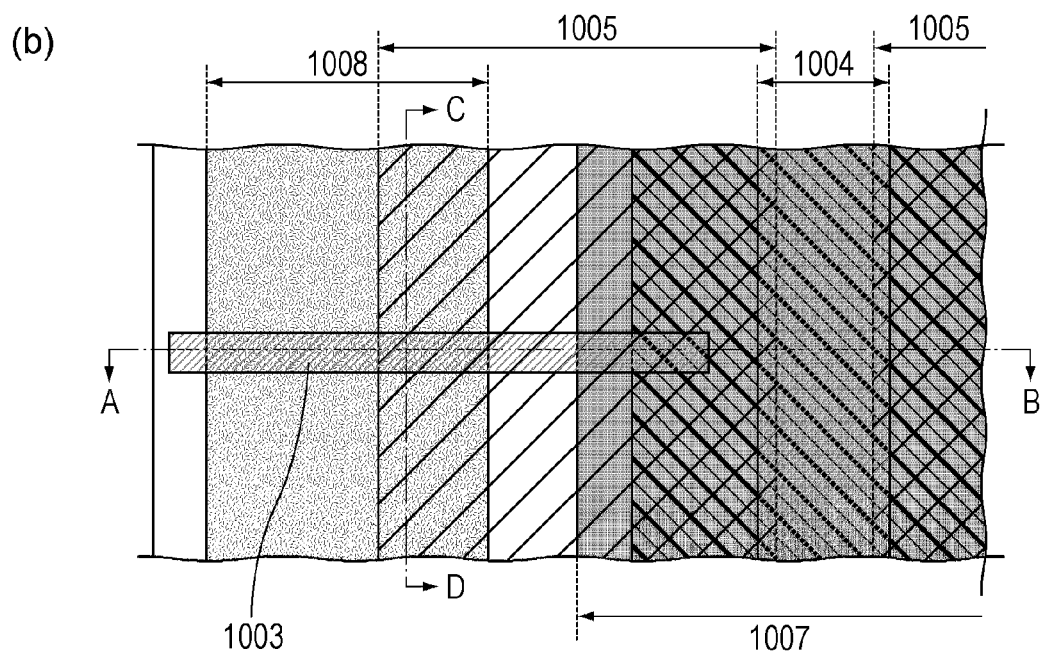
Figure 43:
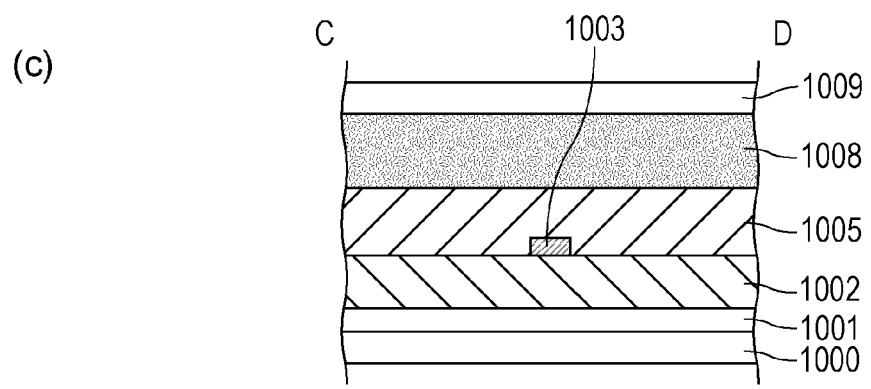
Figure 44:
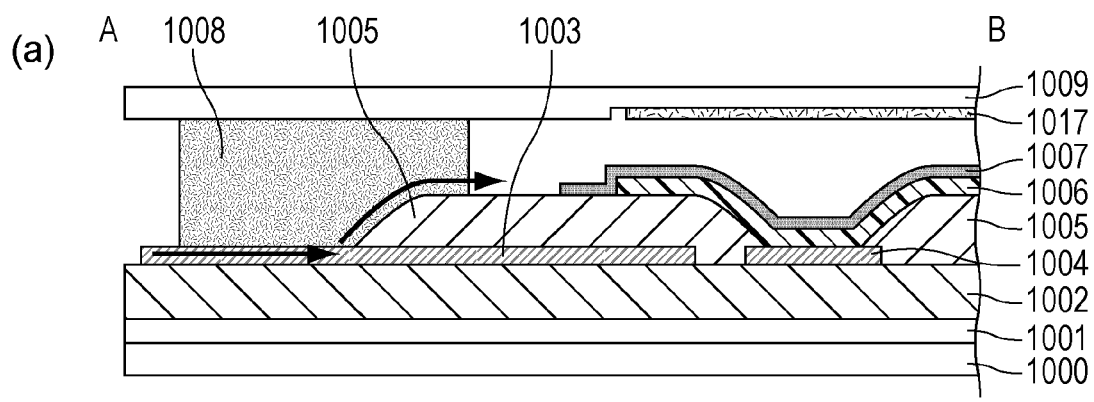
FIGS. 44(a) and 44(b) are schematic cross-sectional views of the light emitting device described in PTL 1 and illustrates the case where a particle adheres to a wire.

FIG. 42 is a schematic cross-sectional view of an organic EL display device according to the fourth embodiment.

As illustrated in FIG. 42, in an organic EL display device 104 according to the fourth embodiment, thin film transistors (TFTs) 7, signal lines 8, a lead wire 9, an inter-layer insulating film 10, first electrodes 11, and an edge cover 12 are disposed on the first substrate 1. An organic insulator 14 is also formed on part of the lead wire 9. The organic insulator 14 is made of the same material of the inter-layer insulating film 10 or the edge cover 12 and formed so as to cover part of at least one side portion of the lead wire 9.

The patterns described in the first and second embodiments can be appropriately adopted as a pattern of the organic insulator 14. The pattern of the organic insulator 14 may be a pattern of at least one line (strip) disposed in a direction that crosses the lead wire 9 or may be an island-like (dot-like) pattern in which at least one portion of the organic insulator 14 is disposed on each of the side portions 22a and 22b of the lead wire 9.

In the case where the organic insulator 14 is made of the same material as the inter-layer insulating film 10, the pattern of the organic insulator 14 is concurrently formed in the process of forming the inter-layer insulating film 10 described in the first embodiment. In this case, the process for forming the organic insulator 14 described in the first embodiment is not required.

However, in the case where the lead wire 9 is formed together with the first electrodes 11 in the process for forming the first electrodes 11, the organic insulator 14 is not allowed to be formed in the process for forming the inter-layer insulating film 10 since the organic insulator 14 needs to be formed after the process for forming the first electrodes 11.

In the case where the organic insulator 14 is formed using the same material as the edge cover 12, the pattern of the organic insulator 14 is concurrently formed in the process for forming the edge cover 12 described in the first embodiment. In this case, the process for forming the organic insulator 14 described in the first embodiment is not required.

As in the case of the first embodiment, this embodiment can attain an organic EL display device that enables size reduction of a frame and that has high reliability and high productivity.

In addition, this embodiment enables reduction of the production process since the pattern of the organic insulator 14 on the lead wire 9 and the inter-layer insulating film 10 or the edge cover 12 in the display region can be concurrently formed from the same material. In other words, this embodiment attains an organic EL display device that has higher productivity than that of the organic EL display device according to the first embodiment.

In the first to fourth embodiments, the case where the lead wire includes overhanging portions has been described. However, the structure and the shape of the lead wire are not limited to particular ones. The structure of the lead wire may be, for example, a single layer structure. The shape of the lead wire may be a forward tapered shape or a reverse tapered shape. Nevertheless, in the case where the lead wire includes overhanging portions, deterioration of the organic EL element is likely to proceed particularly in this structure and thus deterioration of an organic EL element can be particularly effectively inhibited in this case.

The above-described embodiments may be appropriately combined within the scope not departing from the gist of the invention. The modified examples of each embodiment may be combined with other embodiments. For example, the patterns of the organic insulators described in the first and second embodiments may be combined. Alternatively, for example, a barrier film may be formed and the sealant and the second substrate may also be used for sealing.

REFERENCE SIGNS LIST 1 first substrate
2 second substrate
3 sealant
4 sealing member
5 frame region
6 display region
7 thin film transistor (TFT)
8 signal line
9 lead wire
10 inter-layer insulating film
11 first electrode
12 edge cover
13 opening
14 organic insulator
15 EL layer
16 second electrode
17 organic EL element
18 sealed region
19 lower layer
20 middle layer
21 upper layer
22a, 22b side portion
23 overhanging portion
24 first or second inter-inorganic-layer insulating film
25 gap
26 organic insulating film
27, 28, 34 clearance
29 particle
30 barrier film
31 lower layer film
32 upper layer film
33 insufficient coverage portion
101, 102, 103, 104 organic EL display device

The invention claimed is:
1. An organic electroluminescent display device, comprising:
a display region that displays pixels;
a frame region that surrounds the display region; a substrate;
an organic electroluminescent element disposed on the substrate;
a sealing member that covers the organic electroluminescent element;
a lead wire disposed on the substrate and extending from a region covered with the sealing member to an outer side of the sealing member; and
a plurality of organic insulators disposed within the frame region instead of within the display region, wherein
the lead wire includes two opposite side portions of a first layer and a second layer stacked on the first layer,
the second layer includes an overhanging portion sticking out to a side of the first layer,
each of the plurality of organic insulators has an island shape,
the plurality of organic insulators cover the two side portions and the overhanging portion sticking out to a side of the first layer, and
the sealing member covers the plurality of organic insulators and a portion of the second layer of the lead wire.
2. The organic electroluminescent display device according to claim 1, further comprising an edge cover, wherein the organic electroluminescent element includes a first electrode, an electroluminescence layer stacked on the first electrode, and a second electrode stacked on the electroluminescence layer, the edge cover overlaps an edge portion of the first electrode, and the plurality of organic insulators are made of the same material as the edge cover.

3. The organic electroluminescent display device according to claim 1, further comprising an inter-layer insulating film, wherein the organic electroluminescent element includes a first electrode, an electroluminescence layer stacked on the first electrode, and a second electrode stacked on the electroluminescence layer, the inter-layer insulating film is disposed between the first electrode and the substrate, and the plurality of organic insulators are made of the same material as the inter-layer insulating film.

4. The organic electroluminescent display device according to claim 1, wherein the substrate is a first substrate, the sealing member includes a second substrate opposing the first substrate and a sealant that bonds the first substrate and the second substrate together, and the plurality of organic insulators are covered with the sealant.

5. The organic electroluminescent display device according to claim 1, wherein the sealing member includes a barrier film formed by stacking a plurality of insulator films one on top of another, the plurality of insulator films include an inorganic insulating film, and the plurality of organic insulators are covered with the barrier film.

6. The organic electroluminescent display device according to claim 1, wherein the substrate consists of four sides in a periphery, and the plurality of organic insulators are disposed on one side where the lead wire is disposed, and the plurality of organic insulators are not disposed on another side where the lead wire is not disposed.

7. The organic electroluminescent display device according to claim 4, wherein entirety of the plurality of organic insulators is covered with the sealant.

* * * * *